(12) United States Patent
Hara et al.

(10) Patent No.: US 8,279,021 B2
(45) Date of Patent: Oct. 2, 2012

(54) DUPLEXER

(75) Inventors: Motoaki Hara, Miyagi (JP); Jun Tsutsumi, Tokyo (JP); Shogo Inoue, Tokyo (JP); Masafumi Iwaki, Tokyo (JP); Masanori Ueda, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 13/364,075

(22) Filed: Feb. 1, 2012

(65) Prior Publication Data
US 2012/0126913 A1 May 24, 2012

Related U.S. Application Data

(63) Continuation of application No. PCT/JP2010/062145, filed on Jul. 20, 2010.

(30) Foreign Application Priority Data

Aug. 6, 2009 (JP) .................. 2009-183568

(51) Int. Cl.
*H03H 9/00* (2006.01)
*H03H 9/205* (2006.01)
(52) U.S. Cl. ...................... 333/133; 333/193
(58) Field of Classification Search .................. 333/133, 333/187, 188, 189, 190, 193, 194, 195
See application file for complete search history.

(56) References Cited

U.S. PATENT DOCUMENTS

| 6,909,338 B2 * | 6/2005 | Omote ......................... 333/133 |
| 7,573,354 B2 * | 8/2009 | Nishihara et al. ............. 333/133 |
| 2003/0214368 A1 | 11/2003 | Taniguchi |
| 2004/0119561 A1 | 6/2004 | Omote |
| 2004/0140866 A1 | 7/2004 | Taniguchi |
| 2007/0252662 A1 | 11/2007 | Nishihara et al. |
| 2008/0024243 A1 | 1/2008 | Iwaki et al. |
| 2008/0055021 A1 | 3/2008 | Ueda et al. |
| 2010/0148888 A1 | 6/2010 | Hara et al. |
| 2010/0194496 A1 | 8/2010 | Goto et al. |

FOREIGN PATENT DOCUMENTS

| JP | 2003-69382 A | 3/2003 |
| JP | 2003-332885 A | 11/2003 |
| JP | 2004-135322 A | 4/2004 |

(Continued)

OTHER PUBLICATIONS

English Translation of Written Opinion (PCT/ISA/237) issued in PCT/JP2010/062145 mailed in Oct. 2010.

(Continued)

*Primary Examiner* — Dean O Takaoka
(74) *Attorney, Agent, or Firm* — Chen Yoshimura LLP

(57) ABSTRACT

A duplexer with a reduced filter loss is provided. The duplexer includes two or more filters F1 and F2 that are connected to a common terminal and that have different passbands. At least one of the filters F1 and F2 includes a plurality of series resonators S1 to Sn connected in series to a path between an input terminal and an output terminal of the filter, and parallel resonators P1 to Pm connected in parallel to the above-mentioned path. An inductance L1 is connected in parallel to at least one of the series resonators, and the series resonator S1 having the inductance L1 connected in parallel thereto is divided into a plurality of resonators S11 to S13 connected in series.

16 Claims, 22 Drawing Sheets

FOREIGN PATENT DOCUMENTS

| | | |
|---|---|---|
| JP | 2004-173245 A | 6/2004 |
| JP | 2004-242281 A | 8/2004 |
| JP | 2007-300216 A | 11/2007 |
| JP | 2007-336479 A | 12/2007 |
| JP | 2008-85989 A | 4/2008 |
| WO | 2009/060594 A1 | 5/2009 |
| WO | 2009/066380 A1 | 5/2009 |

OTHER PUBLICATIONS

International Search Report (ISR) issued in PCT/JP2010/062145 mailed in Oct. 2010.

Written Opinion (PCT/ISA/237) issued in PCT/JP2010/062145 mailed in Oct. 2010.

* cited by examiner (a)

(b)

(a)

(b)

(a)

(b)

(a)

(b)

(a)

(b)

(a)

(b)

(a)

(b)

(c)

(a)

(b)

(a)

(b)

(a)

(b)

(a)

(b)

(c)

(a)

(b)

(c)

(a)

(b)

(c)

(a)

(b)

DUPLEXER

This application is a continuation of PCT International Application No. PCT/JP2010/062145 designating the United States, filed Jul. 20, 2010, which claims the benefit of Japanese Application No. 2009-183568, filed in Japan on Aug. 6, 2009. Both applications are hereby incorporated by reference in their entireties.

TECHNICAL FIELD

The present application relates to a duplexer used for an electric circuit of a communication apparatus and the like, for example

BACKGROUND ART

Demands for duplexers are increasing at a fast pace due to the rapid spread of wireless devices represented by mobile phones. Duplexers equipped with small acoustic wave elements having high steepness are strongly demanded, for example.

In recent years, a circuit configuration shown in FIG. 1 has been proposed as a ladder type filter (see Patent Documents 1 to 4, for example). In the configuration of FIG. 1, an inductance LP is connected in parallel to a series resonator S1 so that an attenuation pole can be generated in a region of a lower frequency than the filter passband.

RELATED ART DOCUMENTS

Patent Documents

Patent Document 1: Japanese Patent Application Laid-Open Publication No. 2003-332885
Patent Document 2: Japanese Patent Application Laid-Open Publication No. 2003-69382
Patent Document 3: Japanese Patent Application Laid-Open Publication No. 2004-135322
Patent Document 4: Japanese Patent Application Laid-Open Publication No. 2004-242281

SUMMARY OF THE INVENTION

A duplexer can be configured by combining the above-mentioned filter shown in FIG. 1 (hereinafter, also referred to as "the subject filter") and another filter having a different passband (hereinafter, also referred to as "the other filter"), for example. In configuring this duplexer, if a band of "the subject filter" in which an attenuation pole appears is adjusted so as to coincide with the passband of "the other filter", excellent duplexing characteristics can be obtained.

However, because the attenuation pole of "the subject filter" is generated from a resonator having an inductor connected in parallel thereto, when this attenuation pole is placed in the passband of "the other filter", a spurious response of the resonator having the inductor connected in parallel thereto is also placed in the passband of "the other filter." This leads to a problem of increasing a loss in the passband of "the other filter."

In view of the above-mentioned problem, it is an object of the present invention to provide a duplexer with a reduced filter loss.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present invention provides a duplexer including two or more filters that are connected to a common terminal and that have different passbands, at least one of the two or more filters including: a plurality of series resonators connected in series to a path between an input terminal and an output terminal of the filter; and a parallel resonator connected in parallel to the aforementioned path, wherein an inductance is connected in parallel to at least one of the above-mentioned series resonators, and wherein the series resonator having the inductance connected in parallel thereto is divided into a plurality of resonators connected in series.

In another aspect, the present invention provides a duplexer including two or more filters that are connected to a common terminal and that have different passbands, at least one of the two or more filters including: a plurality of series resonators connected in series to a path between an input terminal and an output terminal; a parallel resonator connected in parallel to the path; and an inductance connected in parallel to one of the series resonators so that a spurious response of said one of the series resonators having the inductance connected thereto is placed on the passband of other one of the two or more filters, wherein the one of the series resonators having the inductance connected in parallel thereto is divided into a plurality of resonators connected in series such that an influence of the spurious response of the one of the series resonators upon the passband of the other one of the two or more filters is reduced.

In another aspect, the present invention provides a duplexer including two or more filters that have different passbands, at least one of the two or more filters including: a plurality of series resonators connected in series to a path between an input terminal and an output terminal; a parallel resonator connected in parallel to the path; and an inductance connected in parallel to one of the series resonators, wherein the series resonators are piezoelectric thin film resonators each having a resonance region where an upper electrode and a lower electrode face each other through a piezoelectric film interposed therebetween, and wherein a ratio (A/B) of a longest width A to a shortest width B of the resonance region of the one of the series resonators having said inductance connected in parallel thereto is smaller than a ratio (A/B) of a longest width A to a shortest width B of the resonance region of each of other series resonators.

In another aspect, the present invention provides a duplexer including two or more filters that are connected to a common terminal and that have different passbands, at least one of the two or more filters including: a plurality of series resonators connected in series to a path between an input terminal and an output terminal; a parallel resonator connected in parallel to the path; and an inductance connected in parallel to one of the series resonators, wherein the one of the series resonator having the inductance connected in parallel thereto is constituted of a plurality of piezoelectric thin film resonators connected in series, the plurality of piezoelectric thin film resonators each comprising: a piezoelectric film; and an upper electrode and a lower electrode facing each other through the piezoelectric film interposed therebetween, wherein a shape of a resonance region where the upper electrode and the lower electrode face each other through the piezoelectric film interposed therebetween differs from one another among the plurality of piezoelectric thin film resonators.

EFFECTS OF THE INVENTION

According to the disclosure of the present application, a duplexer with a reduced filter loss can be provided.

It is to be understood that both the foregoing general description and the following detailed description are exemplary and explanatory, and are intended to provide further explanation of the invention as claimed.

DETAILED DESCRIPTION OF EMBODIMENTS

Hereinafter, embodiments of the present invention will be explained in detail with reference to figures.

Figure 1:
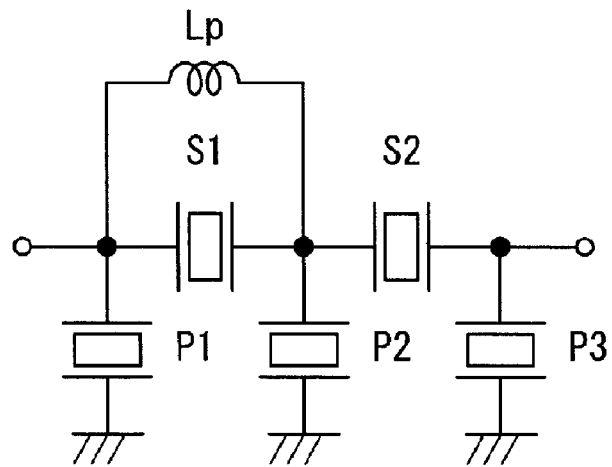
FIG. 1 shows a configuration of a conventional ladder type filter.
Figure 2:
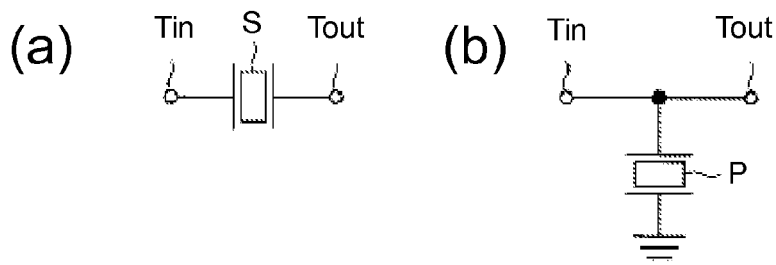
FIG. 2 illustrates a ladder type filter.
Figure 2:
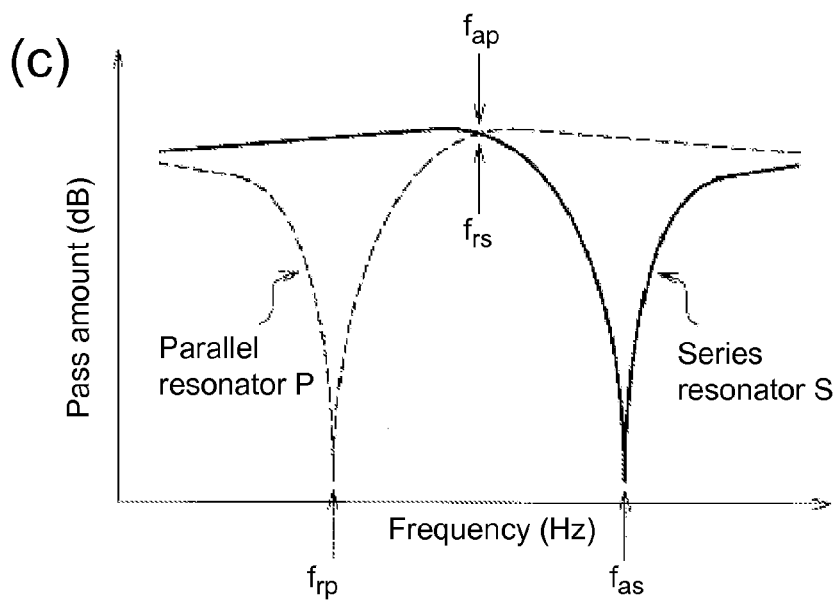
Figure 3:
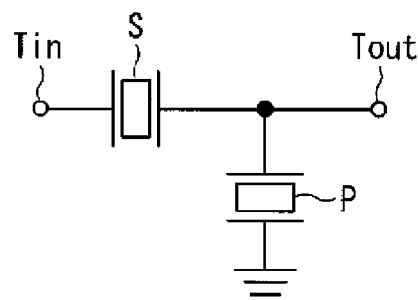
FIG. 3 illustrates a ladder type filter.
Figure 3:
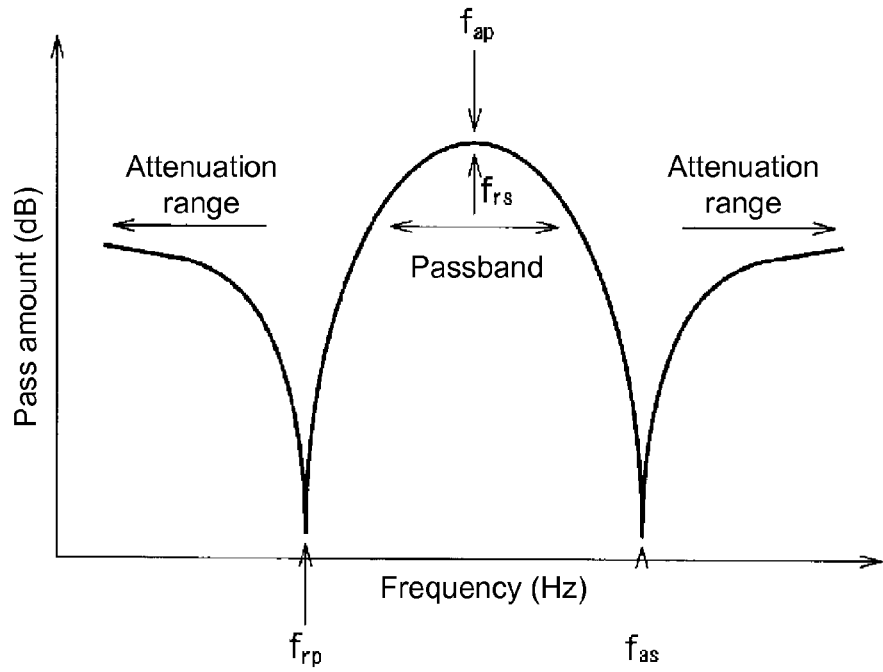

First, examples of resonators, filters, and duplexers which can be used in the present embodiments will be explained. The duplexers include a transmission filter and a reception filter. As a method to obtain these filters using acoustic wave elements, a ladder type filter is widely adopted, for example. The ladder type filter is a high-frequency filter configured by connecting two resonators having different resonant frequencies in a ladder shape. Referring to FIGS. 2 and 3, the ladder type filter will be explained.

FIG. 2(a) shows a series resonator S connected in series between an input terminal Tin and an output terminal Tout. FIG. 2(b) shows a parallel resonator P connected in parallel to a path between the input terminal Tin and the output terminal Tout. The series resonator S has a resonant frequency frs and an antiresonant frequency fas. The parallel resonator P has a resonant frequency frp and an antiresonant frequency fap. FIG. 2(c) is a graph showing frequency characteristics of the series resonator S and the parallel resonator P. In the example shown in FIG. 2(c), the values of fap and frs are substantially same.

FIG. 3(a) is a diagram showing a circuit configuration of a single stage filter (a ladder type pair circuit) having the series resonator S in the serial arm and the parallel resonator P in the parallel arm. When the values of fap and frs are substantially same, the filter characteristics shown in FIG. 3(b) can be realized by arranging the series resonator S and the parallel resonator P in a manner shown in FIG. 3(a).

Figure 4:
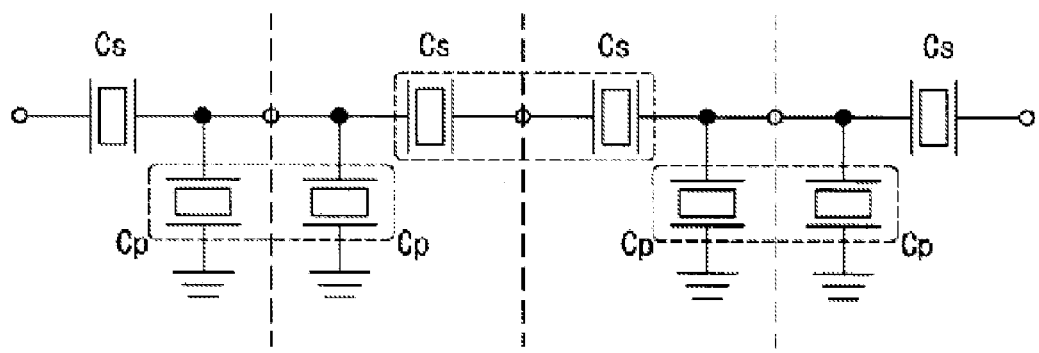
FIG. 4 illustrates a ladder type filter.
Figure 4:
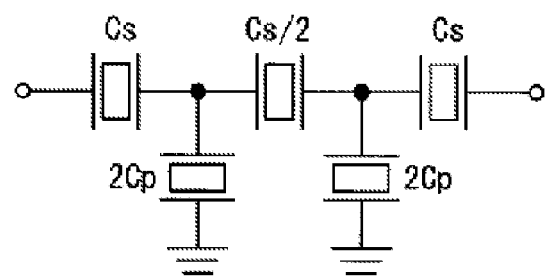

The ladder type filter is configured by connecting a plurality of ladder type pair circuits shown in FIG. 3(a) to form multiple stages. FIG. 4(a) is a circuit diagram showing a configuration example of the ladder type filter. In the example shown in FIG. 4(a), adjacent ladder type circuits are connected in a mirror-reversed manner to each other in order to prevent refection between the respective adjacent stages. In FIG. 4(a), Cs denotes the static capacitance of the resonator in the serial arm, and Cp denotes the static capacitance of the resonator in the parallel arms.

In the multiple-stage connection of the filter shown in FIG. 4(a), there are areas in the serial arm in which the same kind of resonators are connected in series, and areas in the parallel arms in which the same kind of resonators are connected in parallel. In the serial arm and the parallel arms, the adjacent resonators of the same kind can be consolidated and constituted by one resonator. As shown in FIG. 4(b), the adjacent resonators of the same kind can be combined to be one resonator in terms of the static capacitance, for example. That is, two adjacent resonators (the respective capacitances=Cs) in the serial arm can be replaced with one resonator having the capacitance of Cs/2. Two adjacent resonators (the respective capacitances=Cp) in the parallel arms can be replaced with one resonator having the capacitance of 2 Cp.

As the acoustic wave elements included in the ladder type filter, Surface Acoustic Wave (SAW) resonators, piezoelectric thin film resonators (FBAR: Film Bulk Acoustic Resonator, for example), and the like are widely used.

Figure 5:
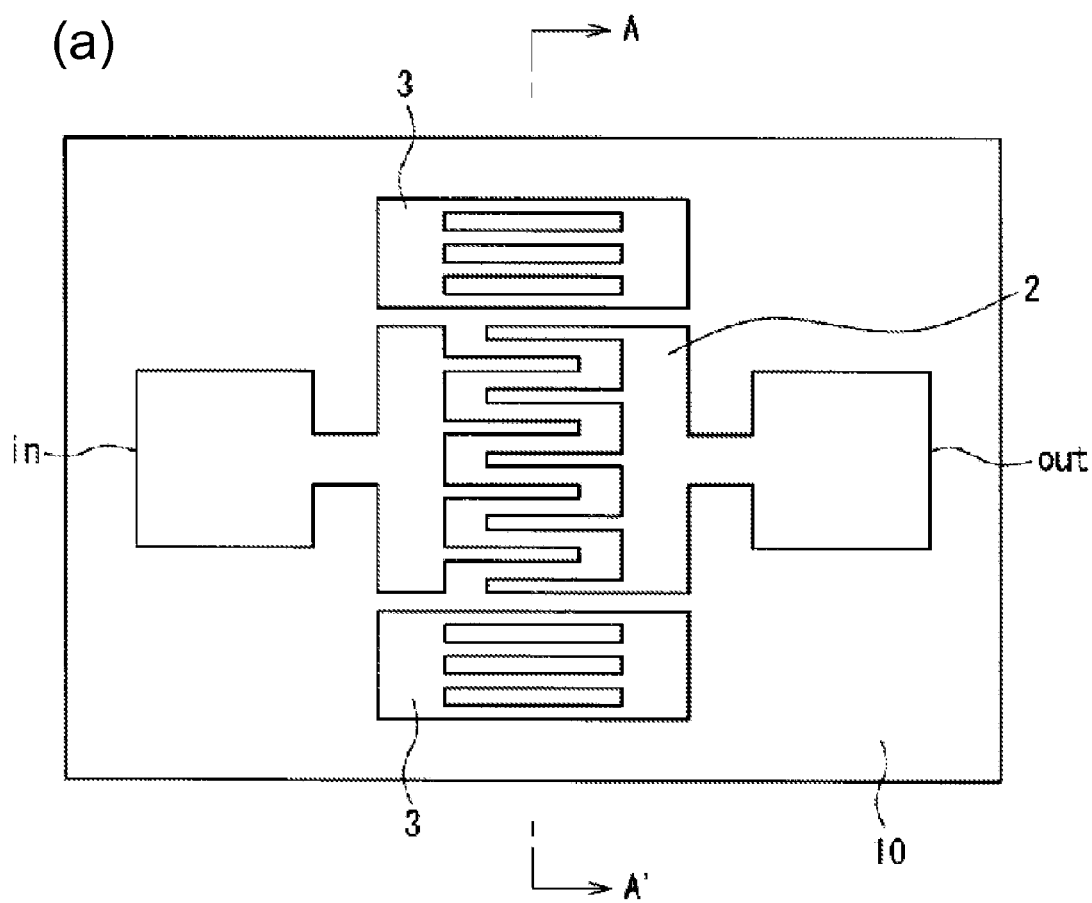
FIG. 5 shows a configuration example of an SAW resonator.
Figure 5:
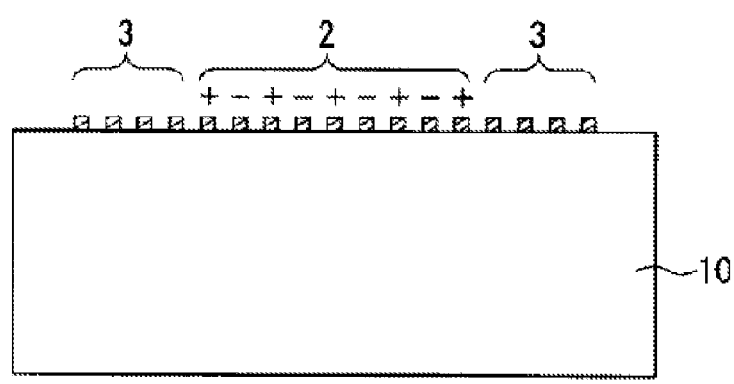

FIG. 5(a) is a plan view showing a configuration example of an SAW resonator. FIG. 5(b) is a cross-sectional view thereof. The SAW resonator has, on a piezoelectric substrate 10, an IDT (Interdigital Transducer) 2, which is excitation electrodes, and grating reflectors 3 disposed on both sides of the IDT 2. An input terminal "in" and an output terminal "out" are connected to the IDT by wiring patterns. The IDT, which is also referred to as comb-shape electrodes, includes a plurality of electrode fingers arranged in parallel to each other with a constant spacing and bus bars connecting these electrode fingers, for example. An acoustic wave propagates in the direction in which the electrode fingers are arranged.

Figure 6:
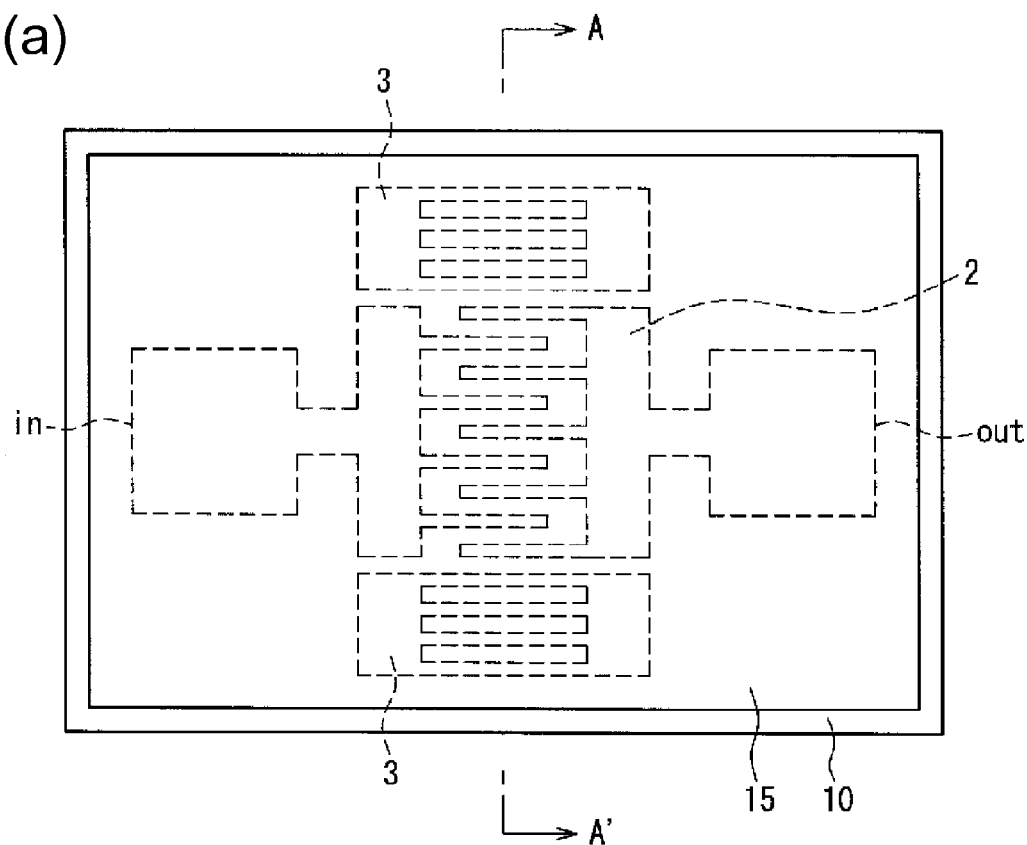
FIG. 6 shows a configuration example of a boundary wave resonator.
Figure 6:
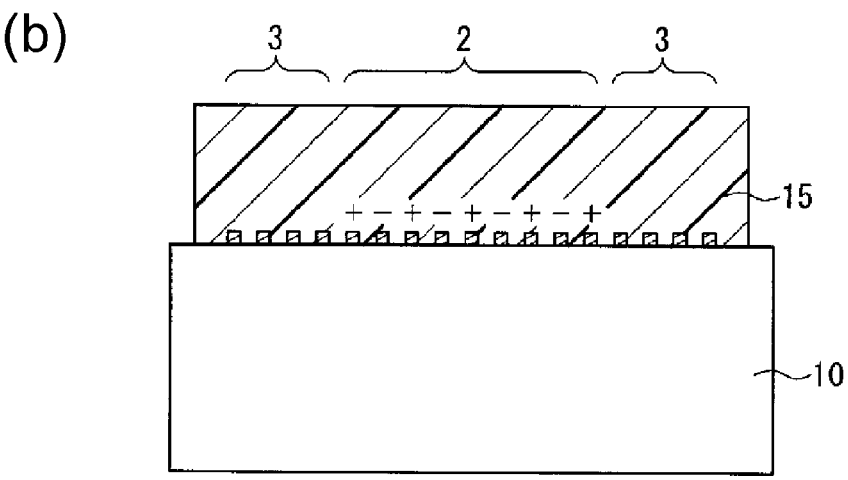
Figure 7:
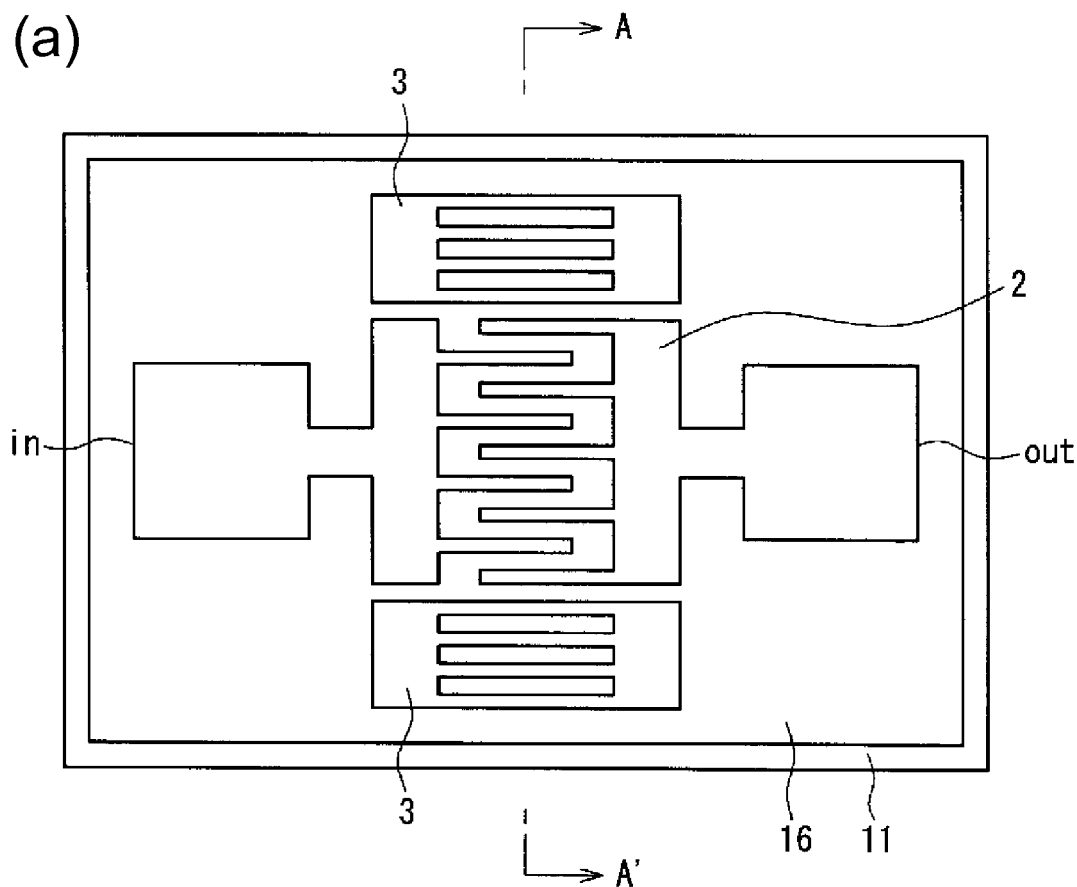
FIG. 7 shows a configuration example of a Lamb wave resonator.
Figure 7:
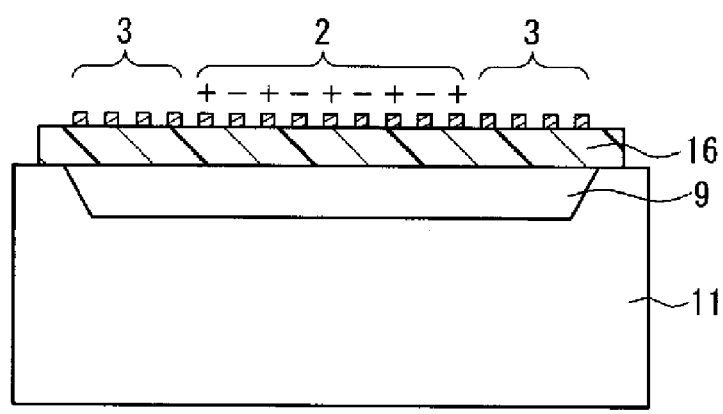

There are different variations of the SAW resonator, which include a boundary wave resonator, a Lamb wave resonator, and the like, for example. FIG. 6(a) is a plan view showing a configuration example of the boundary wave resonator. FIG. 6(b) is a cross-sectional view thereof. In the examples shown in FIG. 6, the boundary wave resonator has a dielectric film 15 disposed on a piezoelectric substrate 10 so as to cover the IDT 2 and the reflectors 3. FIG. 7(a) is a plan view showing a configuration example of the Lamb wave resonator. FIG. 7(b) is a cross-sectional view thereof. In the example shown in FIG. 7, the IDT 2 and the reflectors 3 are disposed on a piezoelectric film 16 that is formed on a substrate 11. Under the area in which the IDT 2 and reflectors 3 are disposed (an excitation region), an air gap 9 is formed between the piezoelectric film 16 and the substrate 11. In the present application, resonators having an IDT, such as the above-mentioned SAW resonator, boundary wave resonator, and the Lamb wave resonator, are collectively referred to as surface acoustic wave resonators.

Figure 8:
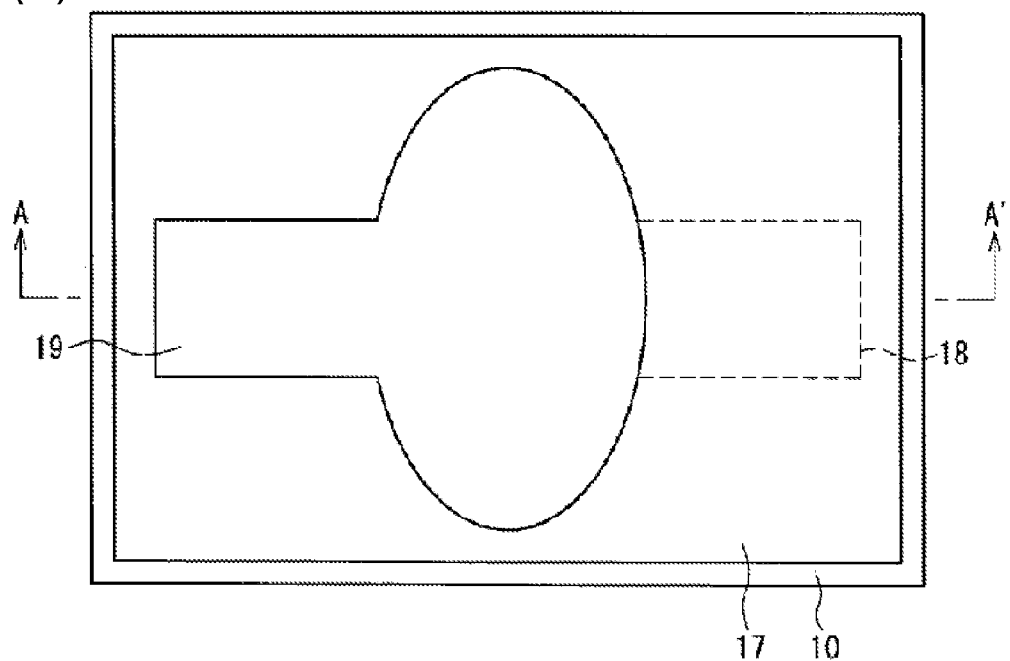
FIG. 8 shows a configuration example of an FBAR.
Figure 8:
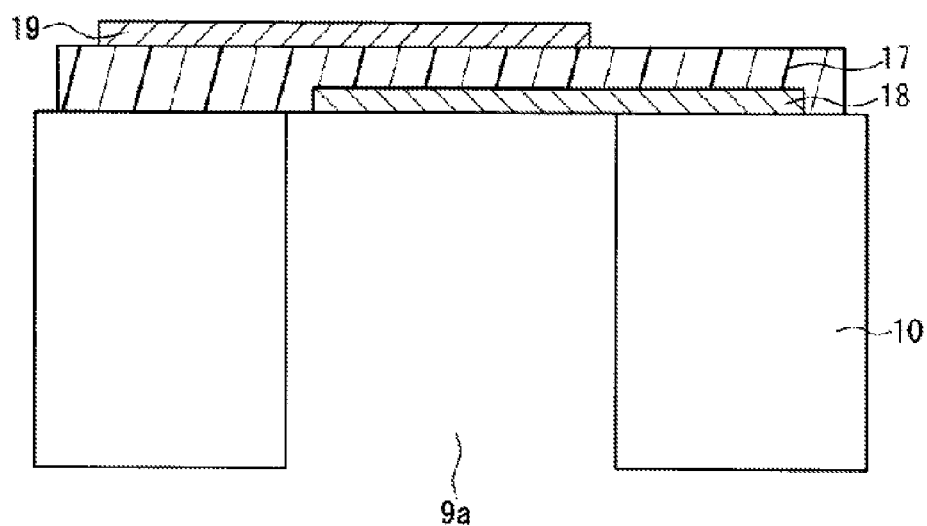

FIG. 8(a) is a plan view showing a configuration example of an FBAR. FIG. 8(b) is a cross-sectional view thereof. In the example shown in FIG. 8, the FBAR includes a piezoelectric film 17 disposed on a substrate 10, and the piezoelectric film 17 is sandwiched by an upper electrode 19 and a lower electrode 18. A region in which the upper electrode 19 and the lower electrode 18 face each other through the piezoelectric film 17 interposed therebetween? becomes an excitation portion (resonance region). An air gap 9a is disposed right below the excitation portion in order to prevent vibration energy from dissipating to the substrate.

There are several types of the air gap in FBARs, which include an air gap that penetrates the substrate disposed below the excitation portion as shown in FIG. 8(b) (via hole type) as well as an air gap that is formed between the excitation portion and the substrate (cavity type).

Figure 9:
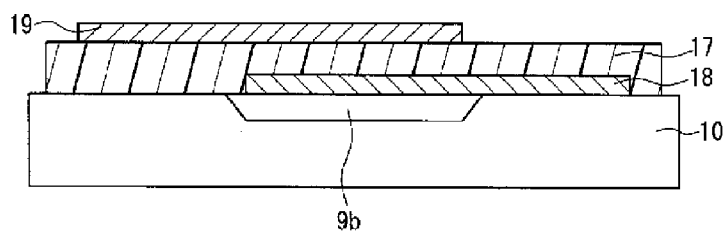
FIG. 9 shows configuration examples for preventing dissipation of vibration energy from an excitation portion in an FBAR.
Figure 9:
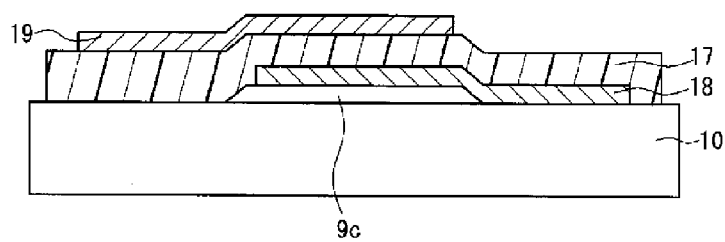
Figure 9:
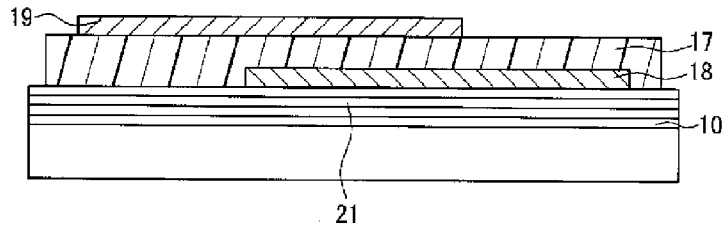

The cavity formation methods include a method of forming an air gap 9b by processing the surface of the substrate as shown in FIG. 9(a), an air-bridge method of forming a dome-shape air gap 9c on the substrate as shown in FIG. 9(b), and the like, for example.

Also, as shown in FIG. 9(c), instead of an air gap, an acoustic multi-layer film formed by laminating alternately a layer with high impedance and a layer with low impedance can be disposed under the excitation portion to prevent the vibration energy dissipation from the excitation portion, for example. This configuration is referred to as an SMR (Solidly Mounted Resonator). In the present application, piezoelectric thin film resonators encompass both the FBAR and the SMR.

Embodiment 1

Figure 10:
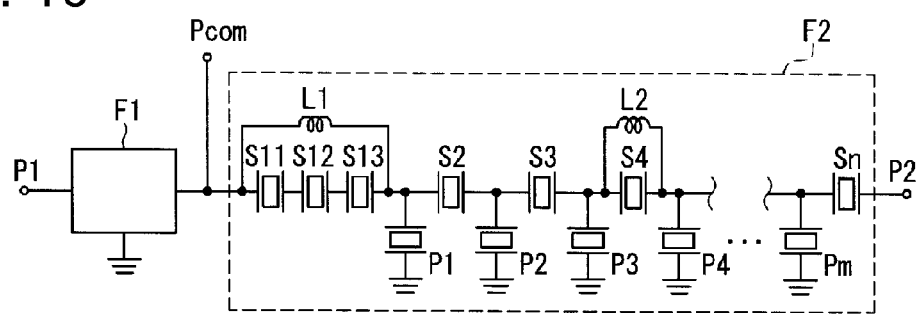
FIG. 10 shows a circuit diagram illustrating a configuration example of a duplexer according to Embodiment 1.

FIG. 10 is a circuit diagram showing a configuration example of a duplexer according to Embodiment 1. The duplexer shown in FIG. 10 includes two filters F1 and F2 that are connected to a common terminal Pcom and that have different passbands. The filter F2 includes a plurality of series resonators S1 to Sn connected in series to a path between the common terminal Pcom of the filter F2 and an input/output terminal P2 of the filter F2, and parallel resonators P1 to Pm connected in parallel to the above-mentioned path. An inductance is connected in parallel to at least one of the series resonators S1 to Sn (S1 and S4 here as an example). The series resonator S1 is divided into a plurality of series resonators S11 to S13 connected in series.

Figure 11:
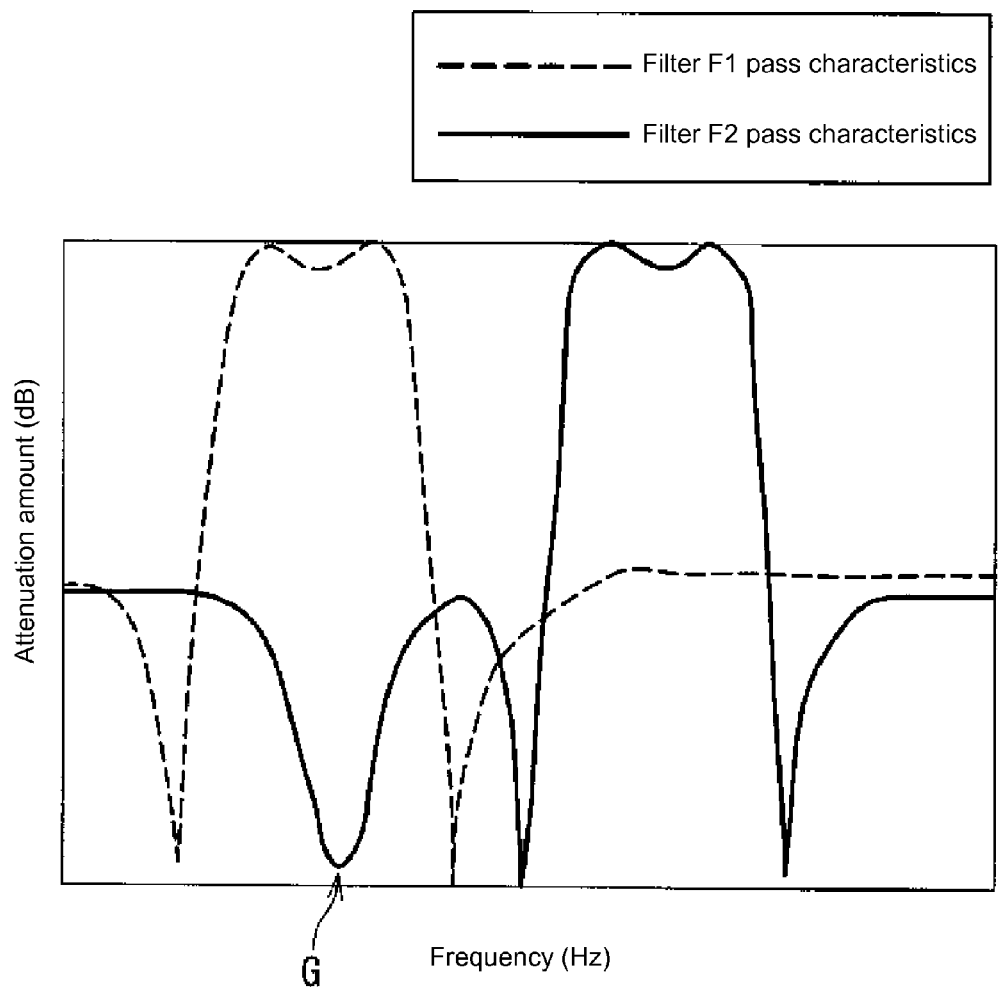
FIG. 11 shows a graph illustrating an example of pass characteristics of filters F1 and F2.

By connecting an inductor in parallel to at least one of the series resonators S1 to Sn as described above, an attenuation pole can be generated outside of the passband of the filter F2. If the attenuation pole is adjusted so as to be included in the passband of the filter F1 ("the other filter"), excellent duplexing characteristics can be obtained, thereby providing the duplexer with a reduced filter loss. FIG. 11 is a graph showing an example of the pass characteristics of the filters F1 and F2 when the attenuation pole G is included in the passband of "the other filter" F1.

In this embodiment, the series resonator S1 having the inductor connected in parallel thereto is divided into a plurality of resonators S11 to S13 connected in series (series division) and therefore, an influence of spurious response in the resonator S1 upon the pass characteristics of the filter F1 can be suppressed. When the resonator is divided in series in a manner described above, the capacitance, i.e., the area of the individual resonator can be increased. Generally, the spurious response that occurs in a resonator is caused by interactions between waves propagating through the resonator and the edges of the resonator. When the resonator is divided in series and the size of the resonator is therefore increased, a sufficient distance can be ensured for the waves to propagate along the surface without influences of the edges of the resonator, thereby suppressing the spurious response.

It is preferable that the plurality of divided resonators S11 to S13 be different from each other in shape. This way, the spurious response regions can be made to differ among the resonators, thereby further suppressing the influence of the spurious response upon the pass characteristics of the filter.

Also, it is preferable that the capacitances of the divided resonators S11 to S13 be equal to one another. This way, substantially constant electrical energy can be supplied to each of the divided resonators S11 to S13, thereby suppressing non-linear responses.

When the resonators S11 to S13 are acoustic wave resonators each including an IDT that is disposed on a piezoelectric substrate and having reflectors provided on both sides thereof, it is possible to set the aperture lengths of the respective resonators S11 to S13 so as to differ from one another. This way, the frequency bands at which the spurious response occurs can be made to differ among the resonators S11 to S13. Further, it is preferable that the product of the number of paired electrode fingers and the aperture length between the fingers be constant among each of the resonators S11 to S13 so that electric energies of the resonators S11 to S13 become equal to one another.

When the resonators S11 to S13 are piezoelectric thin film resonators each including a piezoelectric film and upper and lower electrodes facing each other through the piezoelectric film interposed therebetween, the resonance regions of the respective resonators S11 to S13 can have different shapes from one another. Here, the resonance region is a region in which the upper electrode and the lower electrode face each other through the piezoelectric film interposed therebetween. This way, the frequency bands at which the spurious response occurs can be made to differ among the resonators S11 to S13.

The divided resonators S11 to S13 may be configured such that the respective resonators have different resonant frequencies from one another. This way, the frequency bands at which the spurious response occurs can be made to differ among the resonators S11 to S13, and the influence of the spurious response upon the filter F1 can therefore be suppressed. The resonant frequency can be altered by changing a film thickness of an FBAR or changing an area of the resonance region, for example.

The filter F2 shown in FIG. 10 is an example of a ladder type filter, but the effects similar to above can also be obtained by using a lattice type filter. Also, as in the configuration example shown in FIG. 10, it is preferable that the series resonator having an inductance connected in parallel thereto be a series resonator placed at one end of a ladder type filter or a lattice type filter from a viewpoint of filter characteristics. However, the series resonator having the inductance connected in parallel thereto is not necessarily limited to the resonator placed at the end.

Description of Effects

Figure 12:
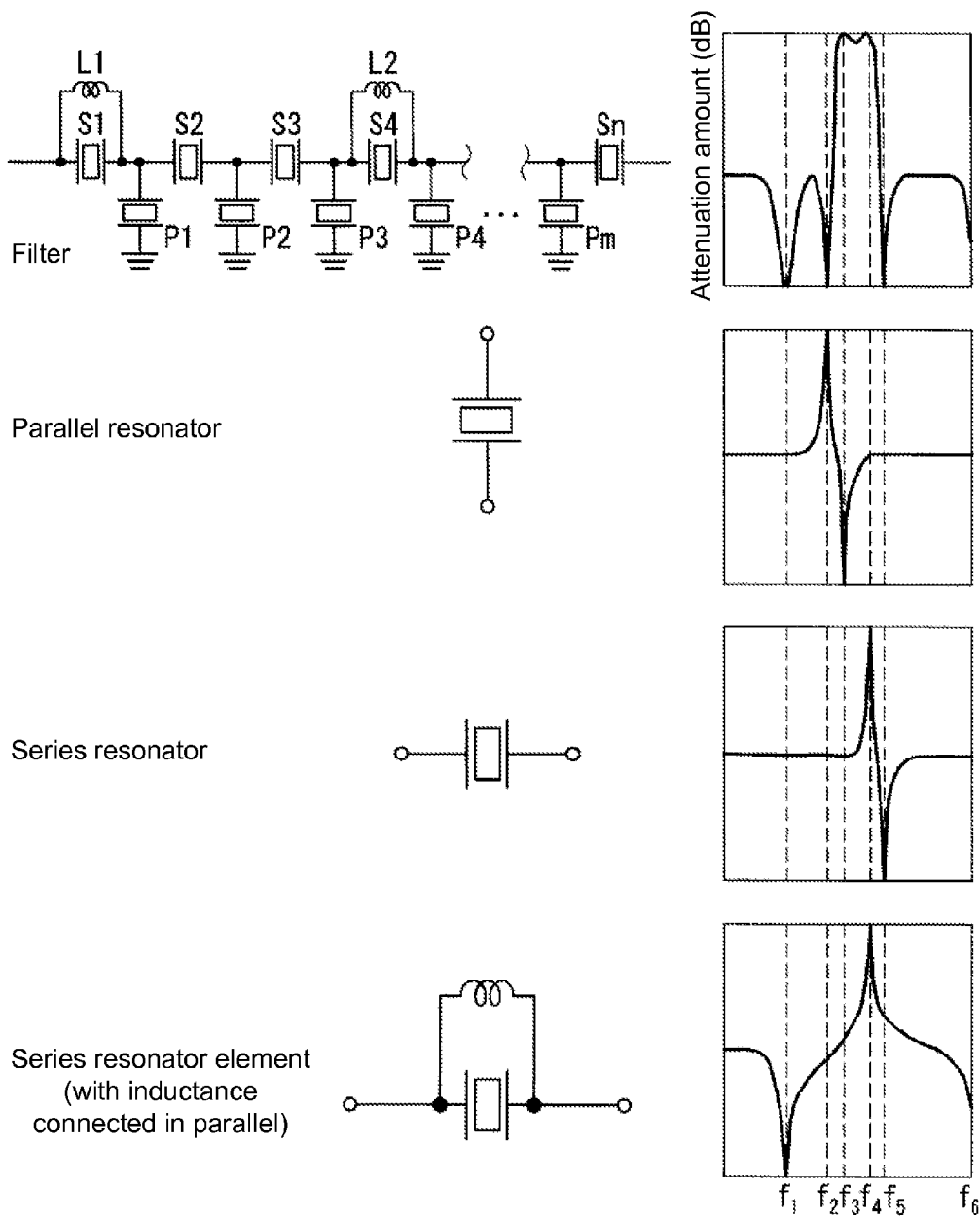
FIG. 12 illustrates filter characteristics obtained when an inductance is connected in parallel to a series resonator of a ladder type filter.

Next, effects of the duplexer according to the present embodiment will be explained. FIG. 12 is a diagram illustrating filter characteristics obtained when an inductance is connected in parallel to a series resonator of a ladder type filter. The graph at the top of FIG. 12 shows filter characteristics of the ladder type filter shown to the left. The second graph from the top shows admittance characteristics of the parallel resonator of the ladder type filter. The third graph from the top shows admittance characteristics of the series resonator of the ladder type filter. The fourth graph from the top shows admittance characteristics of the series resonator with an inductance connected in parallel thereto in the ladder type filter.

In the example shown in FIG. 12, $f_2$ and $f_3$ denote a resonance point and an antiresonance point of the parallel resonator, respectively, and $f_4$ and $f_5$ denote a resonance point and an antiresonance point of the series resonator, respectively. When an inductance is connected in parallel to the series resonator, an antiresonance point is generated at $f_1$ by antiresonance of the capacitance of the resonator and the inductance connected in parallel to the resonator. This antiresonance point generates an attenuation pole in the filter. Here, the antiresonance point $f_5$ of the series resonator is shifted to a high-frequency band $f_6$ by the interaction with the inductance connected in parallel. The resonance point $f_4$ of the series resonator does not change by the addition of the inductance.

In the example shown in FIG. 12, the resonance point $f_4$ of the series resonator having the inductance connected in parallel thereto does not coincide with the antiresonance point $f_3$ of the parallel resonator. Instead, $f_4$ and $f_3$ are narrowly separated from each other so that the passband can be widened.

When the ladder type filter shown in FIG. 12 is employed as one of the filters of a duplexer, the duplexing characteristics can be improved by placing the generated attenuation pole in the passband of "the other filter."

The attenuation pole placed in the passband of "the other filter" is preferably located at the center frequency of the passband of "the other filter", for example. However, in a configuration in which a passband of a transmission filter and a passband of a reception filter are close to each other, such as WCDMA Band2 (transmission band: 1850 MHz to 1910 MHz, reception band: 1930 MHz to 1990 MHz) or Band3 (transmission band: 1710 MHz to 1785 MHz, reception band: 1805 MHz to 1880 MHz), for example, it is desirable that the attenuation pole be placed closer to the high-frequency edge of the passband of "the other filter", instead of the center frequency thereof, so that the steepness of the low-frequency edge of the passband of "the subject filter" can be improved at the same time.

Here, if a spurious response exists in the resonator having the inductance connected in parallel thereto, the spurious response occurs in the filter characteristics as well. The influence of the spurious response, however, greatly varies depending on whether the frequencies at which the spurious response occurs are in the passband or in the non-passband of the filter for the following reasons. In the passband, an electric signal propagates through the resonator, which is an acoustic wave element, mainly as mechanical vibration, and therefore, the electric signal is strongly affected by the spurious response caused by undesired vibrations in the acoustic wave element. On the other hand, in the non-passband, an electric signal propagates mainly by electromagnetic/electrostatic coupling between signal wiring lines, and therefore, the electric signal is less affected by undesired vibrations in the acoustic wave element.

In an acoustic wave element, the spurious response occurs in a region below the resonance point. The influence of the spurious response upon the filter characteristics can be suppressed by placing the resonance point of the series resonator in the vicinity of the antiresonance point of the parallel resonator or by like method so that the problematic spurious response is placed in the non-passband of the filter, for example.

However, when the aforementioned attenuation pole is placed in the passband of "the other filter" in the duplexer, the spurious response of the series resonator having an inductance connected in parallel thereto is placed in the passband of "the other filter", which causes a ripple to be generated in the pass characteristics of "the other filter." This means that it is difficult to suppress the ripple by adjustment of the resonance point and the antiresonance point of the resonators. A specific example thereof will be explained below.

Figure 13:
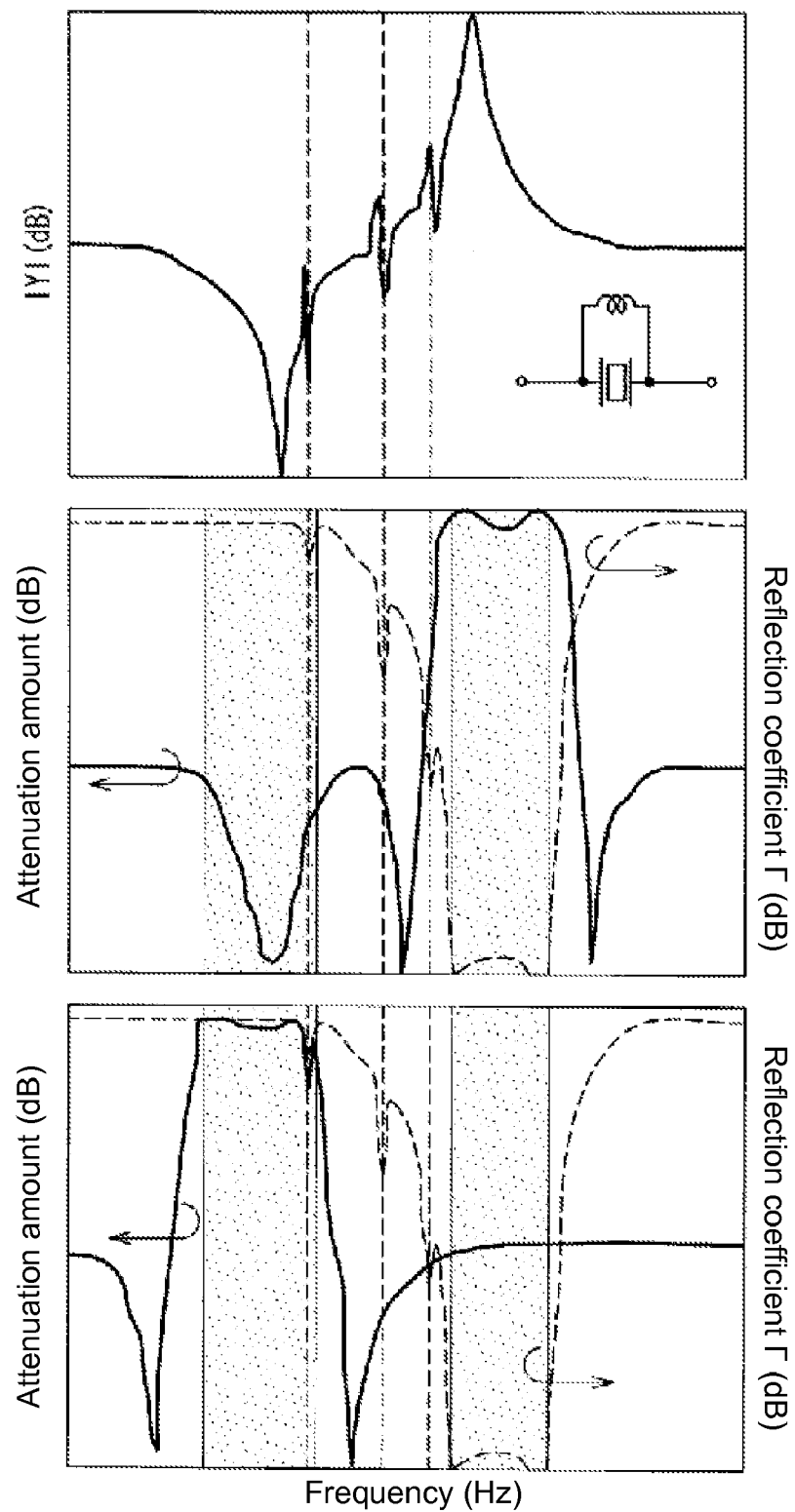
FIG. 13 shows an example of the generation of ripples.

FIG. 13 illustrates an example of the ripple generated in the passband of "the other filter" caused by the spurious response of the series resonator having an inductance connected in parallel thereto. The top graph in FIG. 13 shows an example of admittance characteristics of the series resonator having the inductance connected in parallel thereto. In this example, the spurious response is generated between the resonance point and the antiresonance point. The second graph from the top shows frequency characteristics of the attenuation amount of "the subject filter" (solid line) and frequency characteristics of the reflection coefficient of "the subject filter" as viewed from "the other filter" (dashed line). In the reflection coefficient as well, ripples are generated in positions that correspond to the spurious response frequencies. The third graph from the top shows frequency characteristics of the attenuation amount of "the other filter" (solid line) and frequency characteristics of the reflection coefficient of "the subject filter" as viewed from "the other filter" (dashed line). In this example, a ripple is generated in the passband of "the other filter."

When the resonator having the inductance connected thereto has the spurious response as described above, the total reflection condition in the reflection coefficient of "the subject filter" as viewed from "the other filter" is not satisfied in some places, resulting in ripples as shown in FIG. 13. Due to these ripples, a ripple is generated in the passband of "the other filter" as well.

In order to reduce a loss of "the other filter" in its passband, it is preferable not only to reduce the loss of "the other filter" itself, but also to satisfy the total reflection condition (0 dB) in the reflection coefficient of "the subject filter" as viewed from "the other filter." However, in a configuration in which the passbands of a transmission filter and a reception filter are close to each other, such as WCDMA Band2 or Band3, for example, the spurious response of the resonator having the inductance connected in parallel thereto occurs in the passband of "the other filter", and therefore, it is difficult to suppress the ripples by adjusting the frequency positions of the resonance point, the antiresonance point, and the like.

On the other hand, in the duplexer of the present embodiment, because the series resonator S1 having an inductor connected in parallel thereto is divided into a plurality of resonators S11 to S13 connected in series as described above, the influence of the spurious response of the resonator S1 upon the pass characteristics of the filter F1 can be suppressed. Therefore, even when the attenuation pole of "the subject filter" is disposed in the passband of "the other filter", ripples in the passband of "the other filter" can be suppressed.

Embodiment 2

Figure 14:
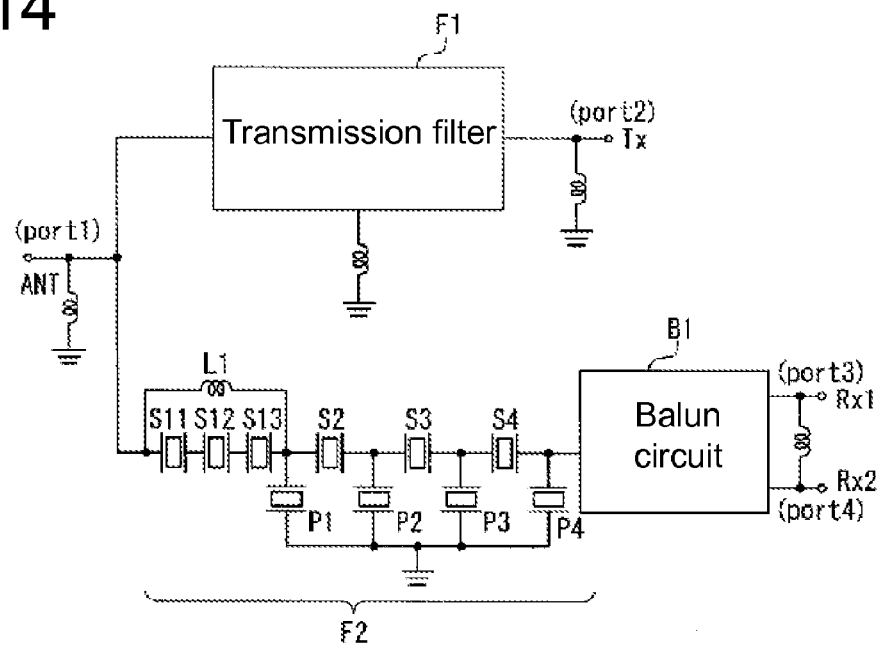
FIG. 14 shows an example of a circuit configuration of a duplexer according to Embodiment 2.

FIG. 14 is a diagram showing a circuit configuration example of a duplexer according to Embodiment 2. The circuit shown in FIG. 14 can be used as a WCDMA Band2 duplexer, for example. In the example shown in FIG. 14, a transmission filter F1 and a reception filter F2 are connected to a common terminal Ant (port1) that is connected to an antenna. The reception filter F2 is connected to a balun circuit B1. The balun circuit B1 is a balanced-unbalanced converter, and converts a single output of the reception filter F2 to a balanced output. In this embodiment, the reception filter F2 that includes a resonator S1 having an inductance connected in parallel thereto is "the subject filter", and the transmission filter F1 is "the other filter."

The reception filter F2 is a seven-stage ladder type filter including series resonators S1 to S4 in the serial arm and parallel resonators P1 to P4 in the parallel arms. An inductance L1 is connected in parallel to the series resonator S1 in the first stage. The series resonator S1 is divided into a plurality of resonators connected in series in a manner similar to Embodiment 1 above.

Figure 15:
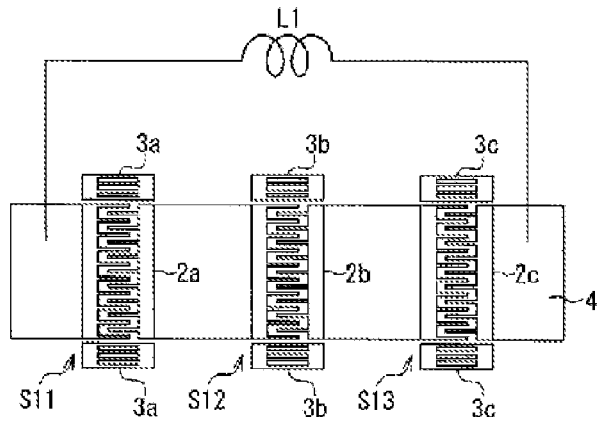
FIG. 15 shows examples of configurations in which acoustic wave resonators are employed to constitute a series resonator S1.
Figure 15:
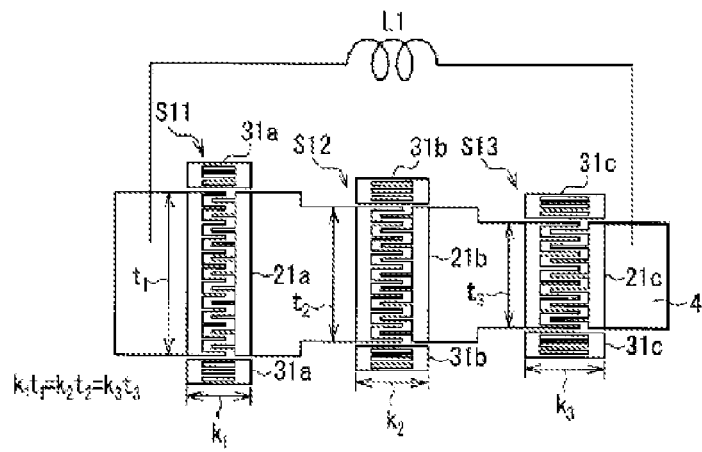

Surface acoustic wave resonators can be employed as the acoustic wave elements that constitute the series resonators S1 to S4, for example. Diagrams in FIG. 15 show configuration examples in which surface acoustic wave resonators are employed as the series resonator S1. FIG. 15(a) shows a configuration example in which the respective divided resonators have the identical shape. Resonators S11 to S13 include IDTs 2a to 2c and reflectors 3a to 3c disposed on both sides of the IDTs, respectively. The IDTs 2a to 2c of the resonators S11 to S13 are connected in series with each other by an electrode 4. The IDTs 2a to 2c of the resonators S11 to S13 have the same aperture length and the same number of paired electrode fingers.

FIG. 15(b) shows a configuration example in which the shapes of the divided resonators differ from one another. The IDTs 21a to 21c of the resonators S11 to S13 in FIG. 15(b) have different aperture lengths and different numbers of the paired electrode fingers. In FIG. 15(b), k1 to k3 represent the aperture lengths of the IDTs 21a to 21c, respectively, and t1 to t3 represent the numbers of the paired electrode fingers of the IDTs 21a to 21c, respectively.

Spurious response of the series resonator S1 having the inductance L1 connected in parallel thereto of the reception filter F2 would appear as a ripple in the pass characteristics of the transmission filter F1. This spurious response, however, can be suppressed by dividing the resonator S1 having the inductance L1 connected in parallel thereto into the resonators S11 to S13 connected in series as shown in FIGS. 15(a) and 15(b). Also, as shown in FIG. 15(b), the spurious response can be further suppressed by, in addition to dividing the resonator S1, varying the aperture lengths and the numbers of the paired electrode fingers of the divided resonators from one another.

When the resonator S1 having the inductance L1 connected in parallel thereto is disposed in the first stage of the reception filter F2, it is particularly desirable that electric energy supplied to the respective divided resonators S11 to S13 be constant so that a non-linear response can be suppressed. For this reason, it is desirable that the respective resonators S11 to S13 have the same capacitance. Specifically, the respective resonators S11 to S13 is preferably configured such that the product of the number of paired electrode fingers and the aperture length therebetween in the respective resonators S11 to S13 become equal to one another. That is, the number of paired electrode fingers and the aperture length therebetween in the respective resonators S11 to S13 are preferably adjusted so as to satisfy k1×t1=k2×t2=k3×t3.

Description of Effects

Figure 16:
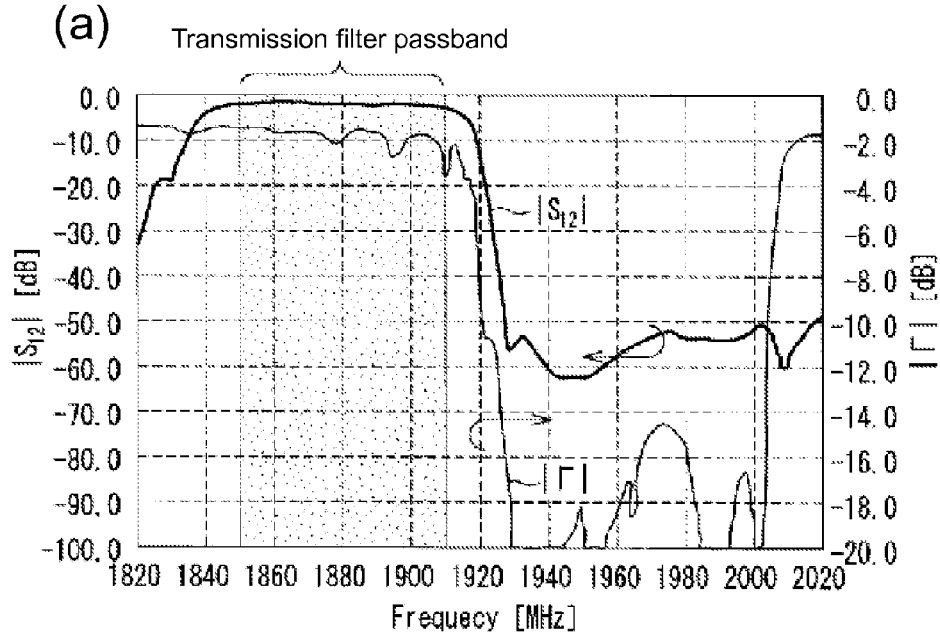
FIG. 16 shows graphs illustrating characteristics obtained in a duplexer of the circuit configuration shown in FIG. 14.
Figure 16:
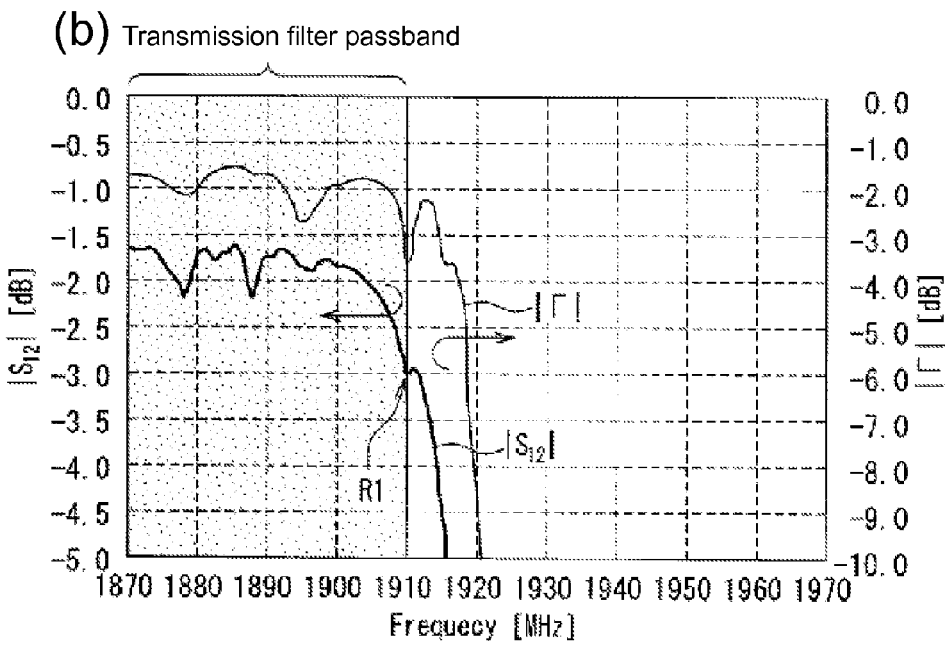

FIG. 16 shows graphs illustrating the characteristics obtained in the duplexer having the circuit configuration shown in FIG. 14 and FIG. 15(a). A graph in FIG. 16(a) shows one example of pass characteristics $S_{12}$ of the transmission filter F1 and the reflection coefficient Γ of the reception filter F2 as viewed from the transmission filter F1. FIG. 16(b) is an enlarged view of the edge of the transmission filter passband in FIG. 16(a). $S_{12}$ and Γ shown in FIG. 16 can be calculated by conducting electromagnetic field simulation with the finite element method, for example.

From FIG. 16, it is confirmed that a ripple R1 occurs in the pass characteristics $S_{12}$ of the transmission filter F1 at the edge of the passband. The frequency at which this ripple R1 occurs substantially coincides with the frequency at which a ripple occurs in the reflection coefficient of the reception filter F2. It should be noted, however, that the characteristics shown in FIG. 16 are much improved from the characteristics shown in FIG. 13.

Figure 17:
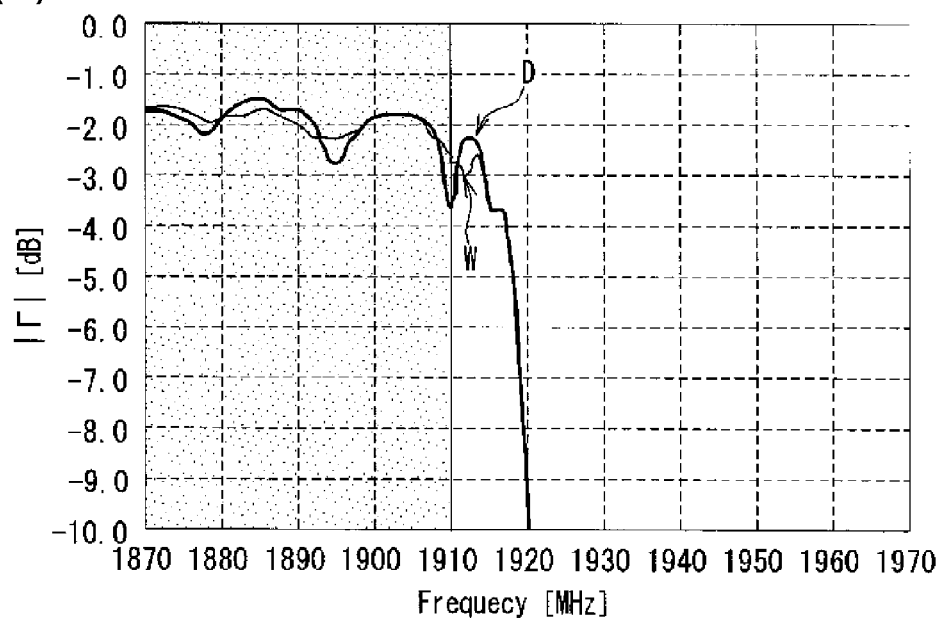
FIG. 17 shows graphs illustrating a reflection coefficient Γ of a reception filter F2 as viewed from a transmission filter F1.
Figure 17:
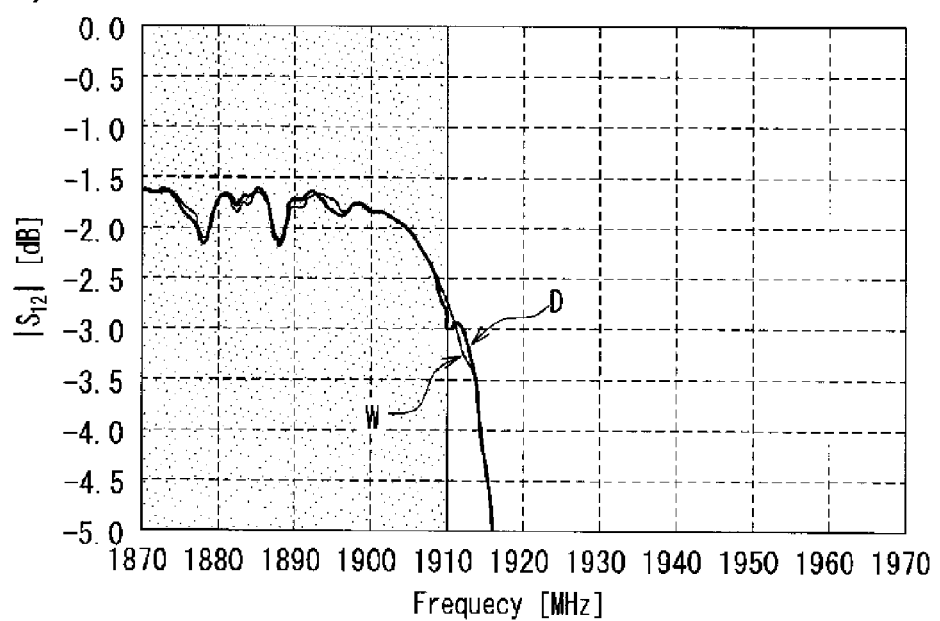

FIG. 17(a) is a graph showing the reflection coefficients Γ of the reception filter F2 as viewed from the transmission filter F1 obtained when the respective resonators S11 to S13 have different shapes as shown in FIG. 15(b) (D), and when the respective resonators S11 to S13 have the identical shape as shown in FIG. 15(a) (W). FIG. 17(b) is a graph showing the pass characteristics $S_{12}$ of the transmission filter F1 obtained when the shapes of the respective resonators S11 to S13 are different (D), and when the shapes are identical (W). Here, the graphs in FIGS. 17(a) and 17(b) show the analysis result for the case in which the number of paired electrode fingers and the aperture length therebetween of the respective resonators are set to the values shown in Table 1 below.

TABLE 1

|  | Identical shape | | | Different shapes | | |
| --- | --- | --- | --- | --- | --- | --- |
| IDT pair number | 45 | 45 | 45 | 40 | 45 | 50 |
| Aperture length | 10.5λ | 10.5λ | 10.5λ | 11.8λ | 10.5λ | 9.47λ |

From the graphs in FIGS. 17(a) and 17(b), it can be confirmed that when the aperture length and the number of paired electrode fingers of the divided resonators S11 to S13 of the reception filter F2 are varied from one another, the reflection coefficient of the reception filter F2 is further improved, and the ripple in the passband of the transmission filter F1 is further suppressed.

Configuration Example for FBAR

Figure 18:
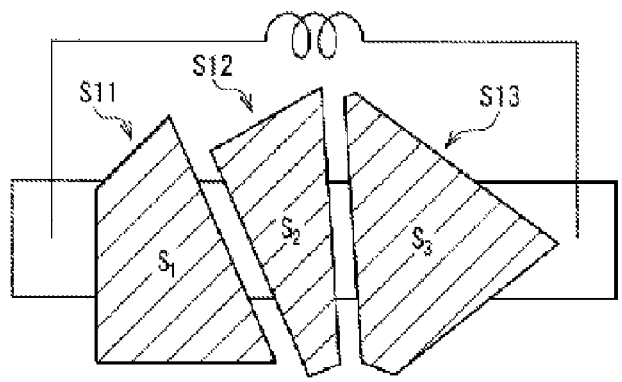
FIG. 18 shows configuration examples of resonators S11 to S13 when the series resonators S1 to S4 shown in FIG. 14 are FBARs.
Figure 18:
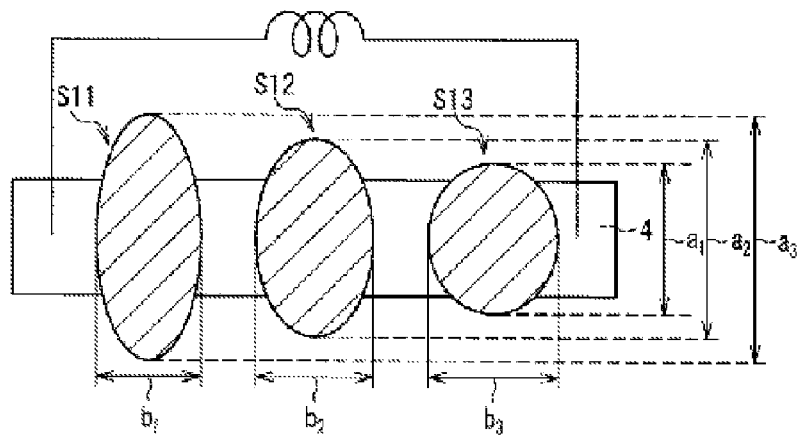
Figure 18:
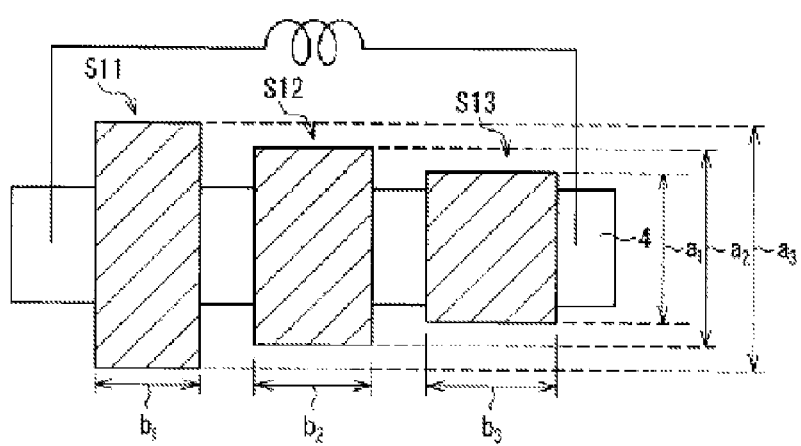

FIG. 18 are diagrams showing configuration examples of the resonators S11 to S13 when the series resonators S1 to S4 shown in FIG. 14 are FBARs. FIGS. 18(a) to 18(c) are top views of the FBARs. A shaded area in the figures indicates a region in which an upper electrode and a lower electrode face each other through a piezoelectric film interposed therebetween (resonance region). In the respective examples shown in FIGS. 18(a) to 18(c), the resonance regions of the divided resonators S11 to S13 are formed in different shapes. In the example shown in FIG. 18(a), the resonance regions of the resonators S11 to S13 are all quadrangular (trapezium). The areas ($S_1$, $S_2$, and $S_3$) of the resonance regions of the resonators S11 to S13 are equal to one another ($S_1=S_2=S_3$). The capacitances of the resonators S11 to S13 become therefore equal to one another.

In the example shown in FIG. 18(b), the resonance regions of the resonators S11 to S13 are elliptical. The ratio of the major axis "a" to the minor axis "b" in the respective resonance regions of the resonators S11 to S13 differs from one another. Therefore, frequencies at which spurious response occurs differ among the resonators S11 to S13. In this way, the spurious response is spread among the resonators S11 to S13, thereby suppressing the influence of the spurious response upon the pass characteristics of the transmission filter F1.

Here, in the resonators S11 to S13, when the resonance regions are formed such that the product of the major axis and the minor axis of each ellipse becomes equal to one another, the respective resonators S11 to S13 can be provided with the same capacitance. Therefore, it is preferable to determine the major axes a1, a2, and a3 and the minor axes b1, b2, and b3 of the ellipses of the resonance regions in the respective resonators S11 to S13 so as to satisfy a1×b1=a2×b2=a3×b3.

In the example shown in FIG. 18(c), the resonance regions of the resonators S11 to S13 are rectangular. The ratio of the long side "a" to the short side "b" in the respective resonance regions of the resonators S11 to S13 differs from one another. In this manner, spurious response in the resonators S11 to S13 is spread out, thereby suppressing the influence of the spurious response upon the pass characteristics of the transmission filter F1. Further, the product of the long side "a" and the short side "b" in the respective resonance regions is equal to one another (a1×b1=a2×b2=a3×b3). When the long sides a1, a2, and a3 and the short sides b1, b2, and b3 of the rectangles of the resonance regions in the respective resonators S11 to S13 are determined in this way, the respective resonators S11 to S13 can be provided with the same capacitance.

As exemplified in FIG. 18, even when FBARs are employed as the resonators of the filter, it is still possible to adjust spurious response by the shape of the FBARs. In the FBAR as well, it is desirable that the divided resonators have the same capacitance, and therefore, it is desirable that areas of the regions in which the upper electrodes and the lower electrode face each other be equal to one another.

Embodiment 3

Figure 19:
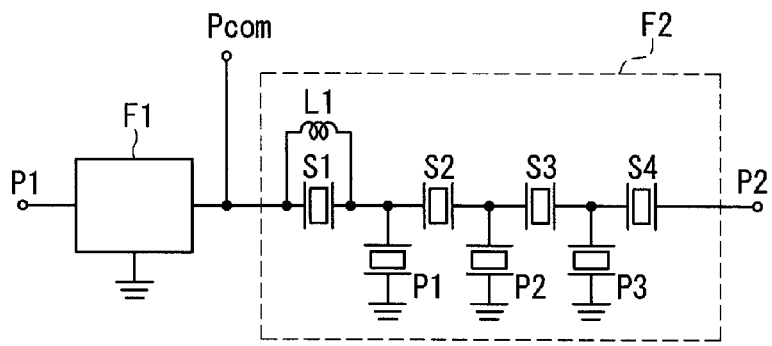
FIG. 19 shows a circuit diagram illustrating a configuration example of a duplexer according to Embodiment 3.

FIG. 19 is a circuit diagram showing a configuration example of a duplexer according to Embodiment 3. The duplexer shown in FIG. 19 includes two filters F1 and F2 that are connected to a common terminal Pcom and that have different passbands. The filter F2 has a plurality of series resonators S1 to S4 connected in series to a path between the common terminal Pcom of the filter F2 and an input/output terminal P2 of the filter F2, and parallel resonators P1 to P3 connected in parallel to the above-mentioned path. At least one of the series resonators S1 to S4 has an inductance connected in parallel thereto (inductances L1 is connected to S1, in this example). The series resonators S1 to S4 are piezoelectric thin film resonators (FBARs, for example) each including a resonance region in which an upper electrode and a lower electrode face each other through a piezoelectric film interposed therebetween. In the series resonator S1 having the inductance L1 connected in parallel thereto, the ratio of the longest width A to the shortest width B (A/B) of the resonance region is smaller than the ratio of the longest width A to the shortest width B (A/B) of the resonance region in the other series resonators S2 to S4.

Figure 20:
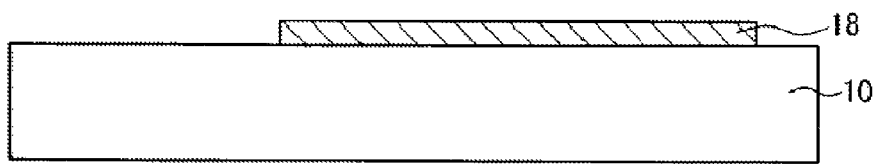
FIG. 20 shows an example of a manufacturing process of an FBAR.
Figure 20:
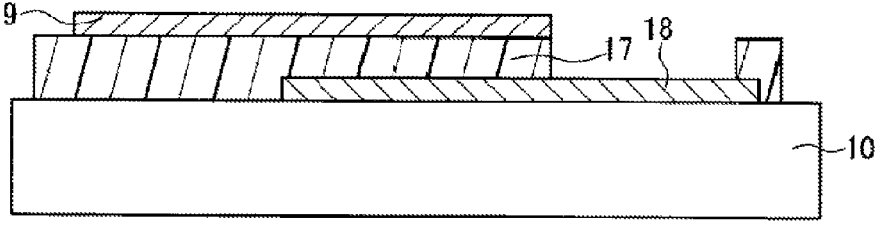
Figure 20:
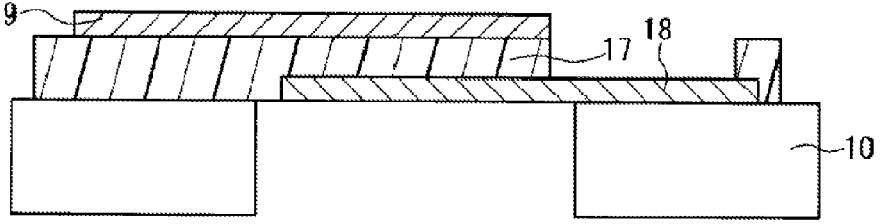

Here, with reference to FIGS. 20(a) to 20(c), an example of a fabrication process of an FBAR will be explained. As shown in FIG. 20(a), on a substrate 10 mainly made of Si, for example, an Ru film is formed by sputtering in an Ar gas atmosphere under a pressure of 0.6 to 1.2 Pa as a lower electrode 18. After that, by exposure and etching, the lower electrode 18 is patterned to have a desired shape.

As shown in FIG. 20(b), on the substrate 10 and on the lower electrode 18, an AlN film is formed by sputtering in an Ar/$N_2$ gaseous mixture atmosphere under a pressure of about 0.3 Pa as a piezoelectric film 17. On the piezoelectric film 17, an Ru film is formed by sputtering in an Ar gas atmosphere under a pressure of 0.6 to 1.2 Pa as an upper electrode 19.

As shown in FIG. 20(c), etching is performed from the rear surface of the substrate 10 utilizing the Deep-RIE (reactive dry etching) method so that an air gap 9a is formed in the substrate 10 under a region in which the lower electrode 18 and the upper electrode 19 face each other through the piezoelectric film 17 interposed therebetween (resonance region). An FBAR is firmed by the process described above.

Figure 21:
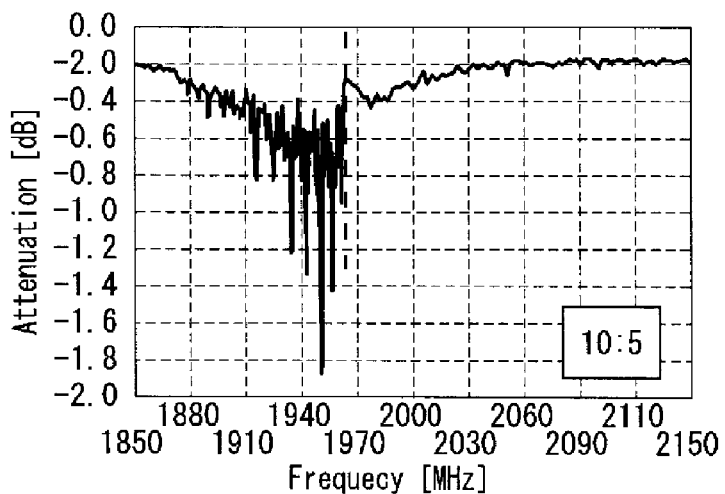
FIG. 21 shows graphs of measurement results of responses of FBARs having elliptic shapes in a case of changing the axis ratio in various ways.
Figure 21:
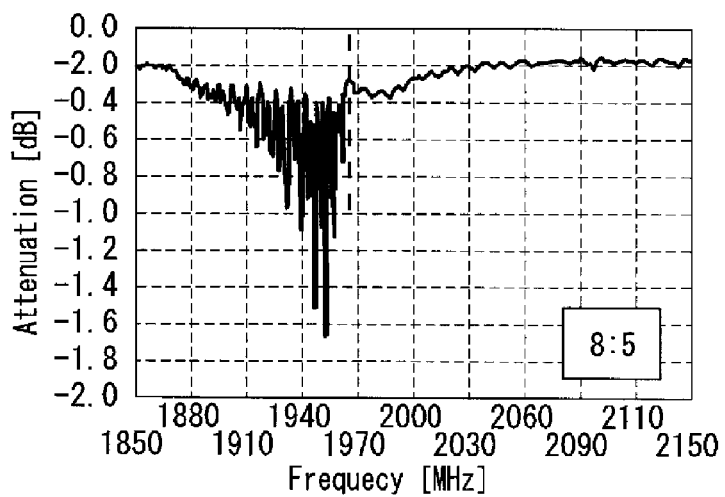
Figure 21:
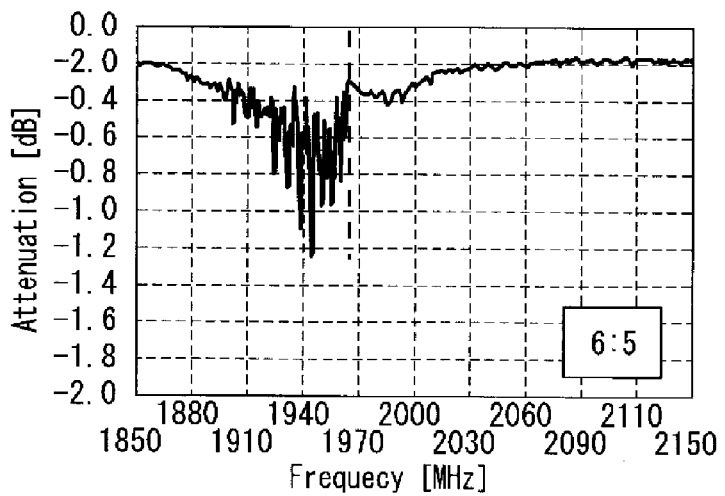

Next, a relationship between the shape of the resonance region and spurious response in the FBAR, and a relationship between the shape of the resonance region and a loss in the FBAR will be explained. FIG. 21 shows the measurement results of the responses of the FBAR having the elliptical resonance region in a case of changing the axis ratio of the resonance region in various ways. Here, the major axis, the minor axis, and the axis ratio in the ellipse that constitutes the resonance region are represented as a, b, and a/b, respectively. In this study, $S_{11}$ (reflection coefficient) was measured with respect to the two-port resonator. Dotted lines in the figure denote the resonance point of the FBAR. The measurement results shown in FIG. 21 were obtained for the FBAR including an Ru upper electrode having a thickness of 250 nm, an AlN piezoelectric thin film having a thickness of 1200 nm, an Ru lower electrode having a thickness of 250 nm, and a capacitance of 0.75 pF. FIGS. 21(a), 21(b), and 21(c) show the measurement results for the axis ratios of 10:5, 8:5, and 6:5, respectively. The graphs indicate that spurious response below the resonance point is reduced with the decrease of the axis ratio.

In the FBAR, spurious response is mainly generated by a Lamb wave propagating in the electrode plane. As the propagation distance becomes shorter, the attenuation becomes smaller, and the spurious response becomes more pronounced. Therefore, in the case of an elliptical resonator, the length of the minor axis that has the shortest propagation distance largely affects the magnitude of the spurious response. When resonators having the same area are compared, as the axis ratio becomes smaller, the minor axis becomes longer, and the spurious response is therefore evaluated as being suppressed.

Figure 22:
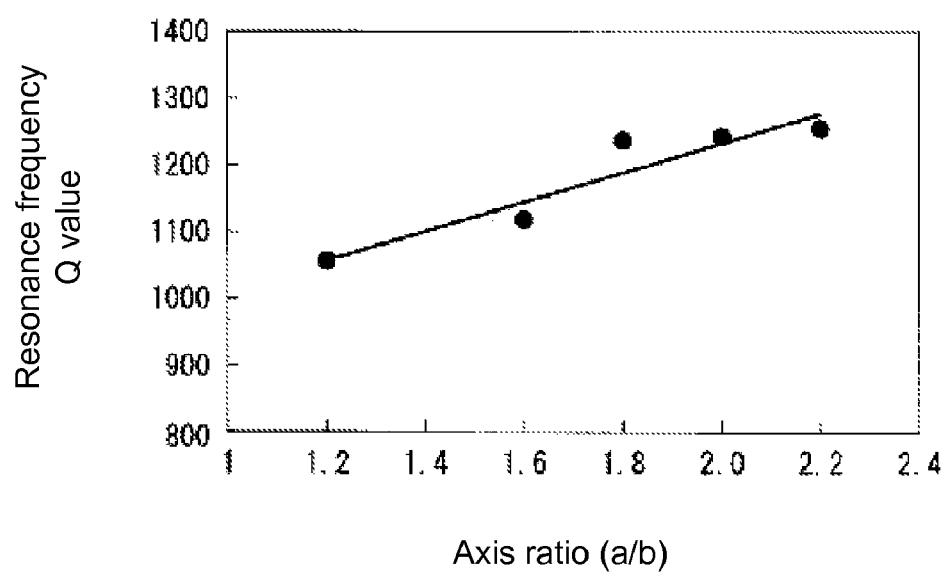
FIG. 22 shows a graph of a measurement result of the Q value at the resonance point of FBARs having elliptic shapes in a case of changing the axis ratio in various ways.

FIG. 22 shows a measurement result of the Q value (Q factor) at the resonance point of the elliptic FBAR in a case of changing the axis ratio in various ways. From the result of FIG. 22, it is confirmed that as the axis ratio becomes greater, the Q value at the resonance point becomes higher. Generally, in a ladder type filter including series resonators and parallel resonators, it is important that the resonance Q value of the series resonator is high, and therefore, when the FBARs are employed as the resonators, it is preferable that the series resonator have a greater axis ratio.

Here, however, in the series resonator S1 having the inductance L1 connected in parallel thereto, the resonance point is placed in the vicinity of the antiresonance point of the parallel resonator, and therefore, the Q value at the resonance point need not necessarily be high. Rather, as far as a duplexer is concerned, it is more important to sufficiently suppress the spurious response that adversely affects the reflection coefficient. Thus, with respect to the desired shape of the resonance region of the series resonator S1, there exists a trade-off between the spurious response and the loss. Accordingly, it is preferable to configure the resonance region of the series resonator S1 having the inductance L1 connected in parallel thereto such that the axis ratio thereof becomes smaller than the axis ratios of the resonance regions of the other series resonators.

As described above, with respect to the series resonator S1 having the inductance L1 connected in parallel thereto, the axis ratio can be adjusted for the purpose of suppressing the spurious response instead of suppressing the loss in view of its frequency characteristics. This makes it possible to design a suitable resonator, taking into account both the suppression of the spurious response and the Q value. Although the elliptical FBAR has been described in detail in this embodiment, as described above, an FBAR in a rectangular shape or in other polygonal shapes can be configured in a manner similar to above to achieve the above-mentioned effects.

Figure 23:
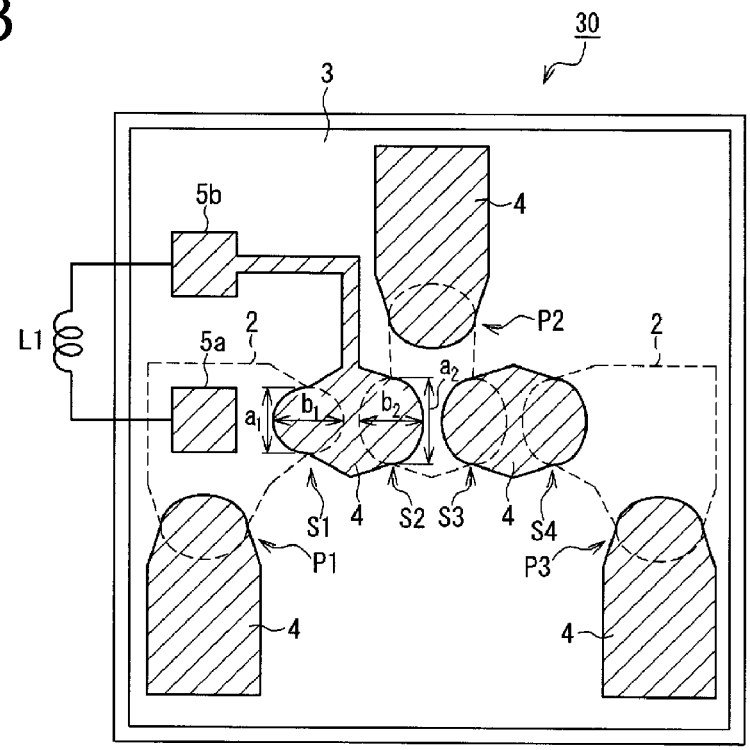
FIG. 23 is a plan view showing a configuration example of the filter F2 shown in FIG. 19.

FIG. 23 is a plan view showing an example of a configuration of the filter F2 shown in FIG. 19. Series resonators S1 to S4 and parallel resonators P1 to P3 are formed in resonance regions in which upper electrodes 4 and lower electrodes 2 face each other through a piezoelectric film 3 interposed therebetween, respectively. In FIG. 23, the locations of the lower electrodes 2 are indicated with the dotted lines. These seven resonators have dome-shape cavities (not shown) between the substrate and the respective resonators, for example. Also, in each of the parallel resonators P1 to P3 in the parallel arms, a 110 nm-thick titanium (Ti) film may be disposed on a 300 nm-thick ruthenium (Ru) film, which is an upper electrode.

In the example shown in FIG. 23, the lower electrode 2 of the series resonator S1 in the first stage is electrically connected to a pad 5a above the piezoelectric film 3, and a wiring pattern between the upper electrode 4 of the series resonator S1 and the upper electrode 4 of the series resonator S2 is electrically connected to a pad 5b. An inductance L1 is connected between the pad 5a and the pad 5b.

In the series resonator S1 having the inductance L1 connected in parallel thereto, the ratio of the major axis $a_1$ to the minor axis $b_1$ ($a_1/b_1$) in the resonance region thereof is smaller than the ratio of the major axis $a_2$ to the minor axis $b_2$ ($a_2/b_2$) in the resonance region of each of the other series resonators S2 to S4. When the axis ratio of the series resonator having the inductance connected in parallel thereto is set to be smaller than the axis ratios of the other series resonators as described above, a suitable design can be realized, taking into account the trade-off relationship between the spurious response and the loss in resonators with respect to the shape of resonators.

Embodiment 4

Figure 24:
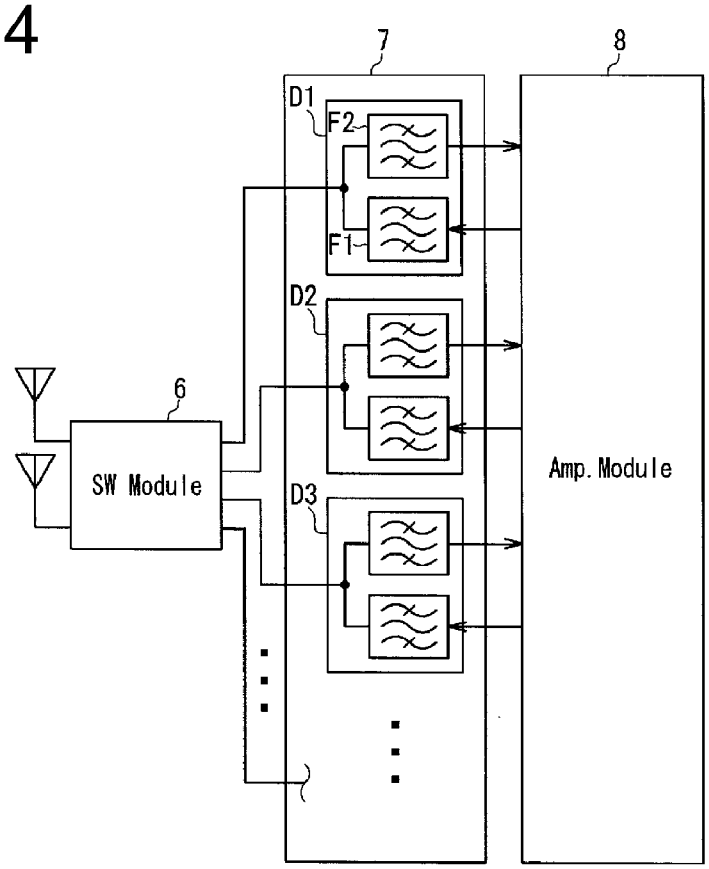
FIG. 24 shows an example of an RF module including the duplexer according to above-mentioned Embodiments 1 to 3.

FIG. 24 is an example of an RF module using the duplexer according to Embodiments 1 to 3 above. In the example shown in FIG. 24, the duplexer is used as a part of a filter bank module (duplexer bank module). The RF module shown in FIG. 24 includes a switch module 6, a duplexer bank module 7, and an amplifier module 8. The duplexer bank module 7 includes a plurality of duplexers D1, D2, D3, . . . , that have different frequency bands. The switch module 6 performs a switching operation of duplexers that process signals transmitted and received at antennas. That is, the switch module 6 selects a duplexer to be used from the duplexers D1, D2, D3, . . . . The amplifier module 8 amplifies signals output from the duplexers D1, D2, D3, . . . , or signals to be input into the duplexers D1, D2, D3, . . . .

Each of the duplexers D1, D2, D3, . . . , includes a transmission filter F1 and a reception filter F2. The duplexer described in any one or more of Embodiments 1 to 3 above is employed as each of the duplexers D1, D2, D3, . . . . As described above, by constituting the RF module by the duplexers having a suppressed filter loss and excellent duplexer characteristics, the RF module with excellent characteristics can be obtained.

The module including duplexers is not limited to the example shown in FIG. 24. Creating a module by combining a duplexer with an amplifier module (Amp. Module) or with a switch module (SW. Module) can also be contemplated, for example. Further, a communication apparatus including a duplexer is also included in embodiments of the present invention.

Figure 25:
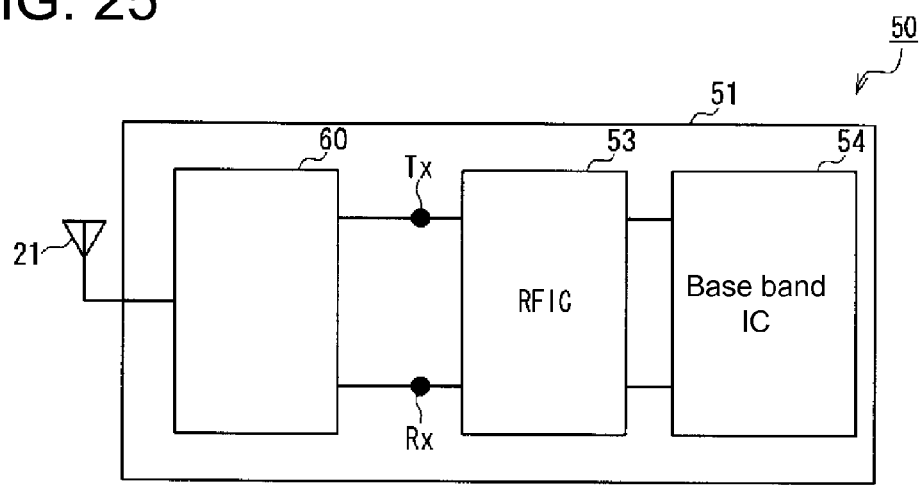
FIG. 25 shows a configuration example of a communication apparatus.

FIG. 25 is a diagram showing a configuration example of a communication apparatus. In a communication apparatus 50 shown in FIG. 25, a communication module 60, an RF IC 53, and a base band IC 54 are disposed on a module substrate 51. The duplexer described in the embodiments above can be used in the communication module 60. The communication module 60 may include the RF module shown in FIG. 24, for example.

A transmission terminal Tx and a reception terminal Rx of the communication module 60 are both connected to the RF IC 53. The RF IC 53 is connected to the base band IC 54. The RF IC 53 can be formed of a semiconductor chip and other components. The RF IC 53 has an integrated circuit that includes a reception circuit that processes a reception signal input from the reception terminal and a transmission circuit that processes a transmission signal.

The base band IC 54 can also be formed of a semiconductor chip and other components. The base band IC 54 has an integrated circuit that includes a circuit for converting reception signals received from the reception circuit included in the RF IC 53 to audio signals or packet data, and a circuit for converting audio signals or packet data to transmission signals and outputting the transmission signals to the transmission circuit included in the RF IC 53.

Although not shown in the figure, an output device such as a speaker or a display, for example, is connected to the base band IC 54 so that audio signals or packet data converted from reception signals in the base band IC 54 can be output and recognized by users of the communication apparatus 50. An input device included in the communication apparatus 50 such as a microphone or a button is also connected to the base band IC 54 so that the base band IC 54 can convert voice or data input from users to transmission signals. The configuration of the communication apparatus 50 is not limited to the example shown in FIG. 25.

Embodiment 5

Figure 26:
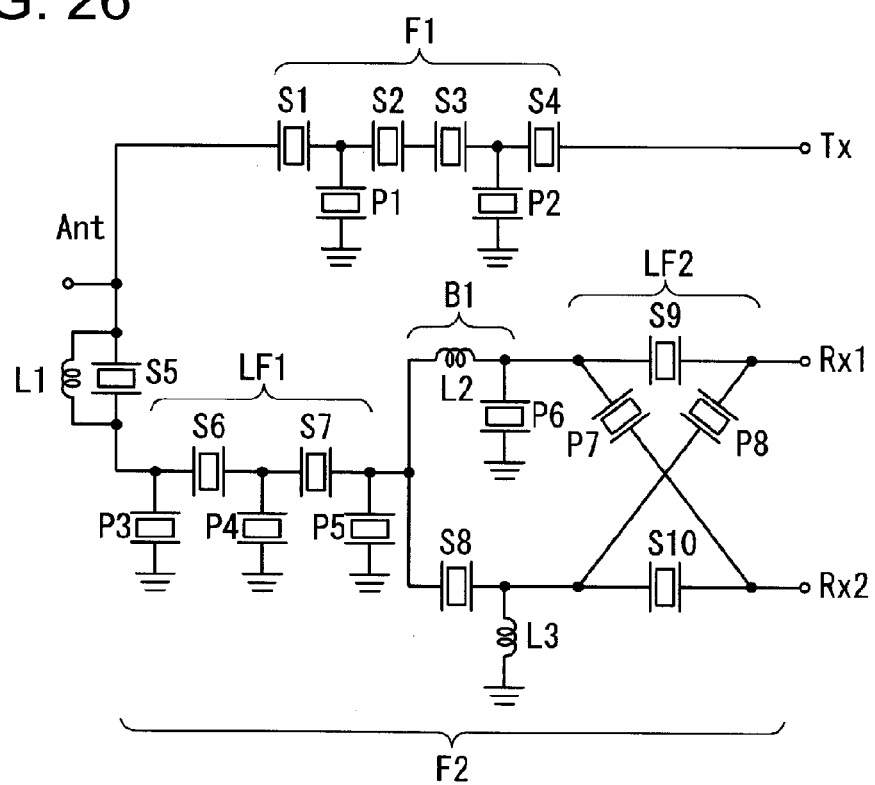
FIG. 26 shows a circuit configuration diagram of a duplexer according to Embodiment 5.

In this embodiment, an example of an actual implementation of the duplexer described in Embodiments 1 to 4 above will be explained. Here, an implementation of a duplexer having the circuit configuration shown in FIG. 26 is explained as an example. In the duplexer shown in FIG. 26, a transmission filter F1 and a reception filter F2 are connected to an antenna terminal Ant. The transmission filter F1 is a ladder type filter including series resonators S1 to S4 and parallel resonators P1 and P2. The reception filter F2 includes a ladder type filter LF1, a concentrated constant balun B1, and a lattice type filter LF2. The ladder type filter LF1 includes series resonators S5 to S7 and parallel resonators P3 to P5.

The ladder type filter LF1 inputs a signal from the antenna terminal Ant through a single terminal and outputs an unbalanced signal to the balun B1. The balun B1 converts the unbalanced signal from the ladder type filter LF1 to a balanced signal. The lattice type filter LF2 is a balanced input/output filter that inputs a balanced signal and outputs a balanced signal. An inductance L1 is connected in parallel to the series resonator S5 in the first stage of the ladder type filter LF1. The series resonator S5 and the inductance L1 form a matching circuit. The series resonator S5 may be divided into a plurality of resonators in a manner similar to Embodiments 1 and 2 above, or may have a different shape from other series resonators as in Embodiment 3. In this embodiment, the division or the shape difference of the resonator is not shown in the figure for simplification.

Figure 27:
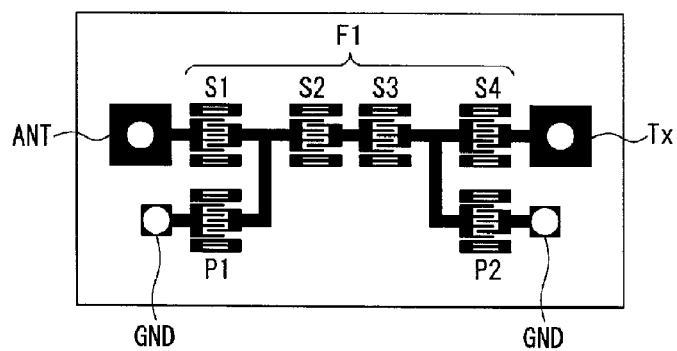
FIG. 27 shows a configuration example for forming the transmission filter F1 and the reception filter F2 shown in FIG. 26 into chips.
Figure 27:
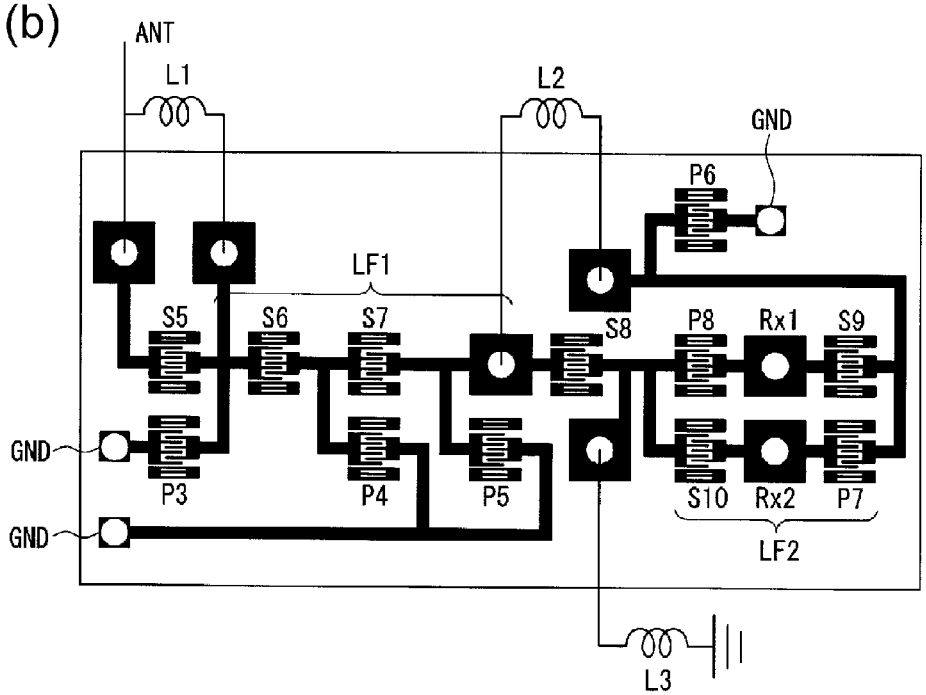

FIG. 27(a) is a diagram showing an example of a configuration in which the transmission filter F1 shown in FIG. 26 is formed as a chip. In the example shown in FIG. 27(a), the series resonators S1 to S4 and the parallel resonators P1 and P2 are formed of IDTs and reflectors on a piezoelectric substrate. Further, a bump connected to the antenna terminal Ant, a bump connected to the transmission terminal Tx, and ground terminals (GND) are formed. The resonators S1 to S4, P1, and P2, the bumps, and the ground terminals are connected through wiring patterns on the piezoelectric substrate.

FIG. 27(b) is a diagram showing an example of a configuration in which the reception filter F2 shown in FIG. 26 is formed as a chip. In the example shown in FIG. 27(b) as well, resonators S5 to S10 and P3 to P8 are formed of IDTs and reflectors on a piezoelectric substrate. Further, a bump connected to an antenna terminal Ant, bumps connecting an inductor L1 for a matching circuit, bumps connecting inductors L2 and L3 for a balun B1, bumps connected to reception terminals Rx1 and Rx2, and ground terminals are formed. The example shown in FIG. 27(b) illustrates a configuration in which the inductor L1 for the matching circuit and the inductors L2 and L3 for the balun 2 are disposed outside of the chip.

Figure 28:
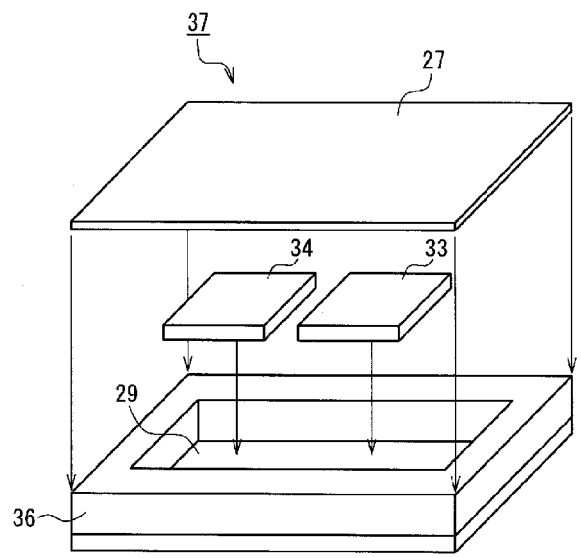
FIG. 28 shows a configuration example of a duplexer package.

FIG. 28 is a diagram showing a configuration example of a duplexer package in which the transmission filter chip shown in FIG. 27(a) and the reception filter chip shown in FIG. 27(b) are packaged. In the example shown in FIG. 28, the transmission filter chip 33 and the reception filter chip 34 are packaged in a ceramic package 36 having a cavity 29 using the flip chip mounting. The transmission filter chip 33 is a chip that constitutes the transmission filter F1 (FIG. 27(a)), and the reception filter chip 34 is a chip that constitutes the reception filter F2 (FIG. 27(b)). These respective chips are electrically connected to the ceramic package 36 through Au bumps, for example. On top of the ceramic package 36 in which these chips are packaged, a metal lid 27 is disposed as a cap so that the cavity 29 is hermetically sealed. The configuration of the package is not limited to the example shown in FIG. 28. An IPD chip constituting the balun B1 may be prepared separately and placed in the cavity 29.

Figure 29:
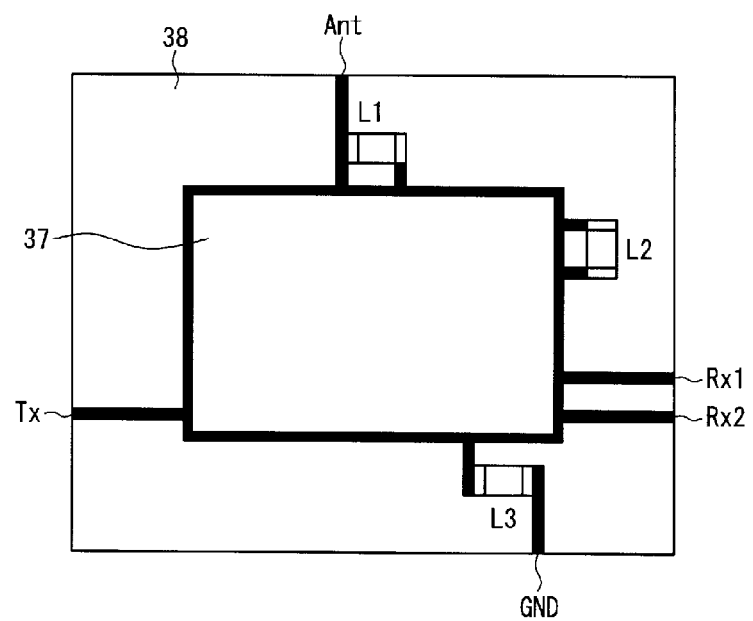
FIG. 29 shows a configuration example of a duplexer package 37 and inductors mounted on a substrate.

FIG. 29 is a diagram showing a configuration example for mounting the duplexer package 37 shown in FIG. 28 and inductors on a substrate. In the example shown in FIG. 29, the duplexer package 37 is mounted on a printed circuit board 38. Chip components of the inductors L1, L2, and L3 are also mounted on the printed circuit board 38. Bumps of the inductors L1, L2, and L3 and of the duplexer package 37 are connected through wiring patterns on the printed circuit board 38. Also, the transmission terminal Tx, the reception terminals Rx1 and Rx2, and the ground terminal of the duplexer package 37 are led to the outside by the wiring patterns on the printed circuit board 38.

Figure 30:
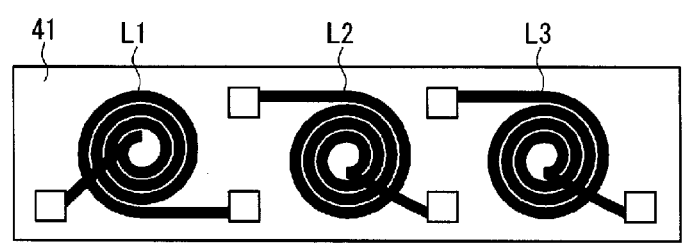
FIG. 30 shows a configuration example of a component in which inductors L1, L2, and L3 are formed on a quartz substrate.

The packaging of the duplexer is not limited to the above-mentioned example. The inductors L1, L2, and L3 can be configured in a unified manner as a single component. FIG. 30 is a diagram showing a configuration example of a component in which the inductors L1, L2, and L3 are formed on a quartz substrate. In the example shown in FIG. 30, three spiral coils are formed on a quartz substrate 41, and terminals of the respective spiral coils are formed of pads.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined, and such combinations are regarded as covered by the present invention to the extent they fall within the scope of the appended claims and their equivalents.

The invention claimed is:

1. A duplexer comprising two or more filters that are connected to a common terminal and that have different passbands, at least one of the two or more filters comprising:
   a plurality of series resonators connected in series to a path between an input terminal and an output terminal;
   a parallel resonator connected in parallel to said path; and
   an inductance connected in parallel to one of the series resonators,
   wherein said one of the series resonators having said inductance connected in parallel thereto is divided into a plurality of resonators connected in series, and
   wherein said plurality of resonators constituting said one of the series resonators having said inductance connected in parallel thereto have different shapes from one another.

2. The duplexer according to claim 1, wherein said at least one of the two or more filters is a ladder type filter or a lattice type filter, and
   wherein said one of the series resonators having said inductance connected in parallel thereto is located in a foremost stage of said ladder or lattice type filter closest to the input terminal.

3. The duplexer according to claim 1, wherein said plurality of resonators constituting said one of the series resonators having said inductance connected in parallel thereto have a same capacitance.

4. The duplexer according to claim 1, wherein said plurality of resonators constituting said one of the series resonators having said inductance connected in parallel thereto are surface acoustic wave resonators each comprising:
   an IDT disposed on a piezoelectric substrate; and
   reflectors disposed on both sides of the IDT, wherein an aperture length in said IDT differs among said plurality of resonators constituting said one of the series resonators.

5. The duplexer according to claim 4, wherein the number of electrode fingers in the IDTs and the distance between a pair of electrode fingers in the IDTs of the respective surface acoustic wave resonators are configured such that each of the surface acoustic wave resonators has a same capacitance.

6. The duplexer according to claim 1, wherein said plurality of resonators constituting said one of the series resonators having the inductance connected in parallel thereto are piezoelectric thin film resonators each comprising:
a piezoelectric film; and
an upper electrode and a lower electrode facing each other through the piezoelectric film interposed therebetween,
wherein a shape of a resonance region where the upper electrode and the lower electrode face each other through the piezoelectric film interposed therebetween differs from one another among said piezoelectric thin film resonators constituting said one of the series resonators.

7. The duplexer according to claim 1, wherein said plurality of resonators constituting said one of the series resonators having the inductance connected in parallel thereto are piezoelectric thin film resonators each comprising:
a piezoelectric film; and
an upper electrode and a lower electrode facing each other through the piezoelectric film interposed therebetween,
wherein resonant frequencies of the respective piezoelectric thin film resonators differ from one another.

8. A duplexer comprising two or more filters that have different passbands, at least one of the two or more filters comprising:
a plurality of series resonators connected in series to a path between an input terminal and an output terminal;
a parallel resonator connected in parallel to said path; and
an inductance connected in parallel to one of the series resonators,
wherein said series resonators are piezoelectric thin film resonators each having a resonance region where an upper electrode and a lower electrode face each other through a piezoelectric film interposed therebetween,
wherein a ratio (A/B) of a longest width A to a shortest width B of the resonance region of said one of the series resonators having said inductance connected in parallel thereto is smaller than a ratio (A/B) of a longest width A to a shortest width B of the resonance region of each of other series resonators,
wherein the Q factor of said one of the series resonators having said inductance connected in parallel thereto is smaller than the Q factor of each of the other series resonators.

9. The duplexer according to claim 8, wherein each of the resonance regions of said series resonators has a substantially elliptic shape, and the major axis A to the minor axis B of the elliptic resonance region of said one of the series resonators having said inductance connected in parallel thereto is smaller than the ratio (A/B) of the major axis A to the minor axis B of the resonance region of each of the other series resonators.

10. The duplexer according to claim 8, wherein said at least one of the two or more filters is a ladder type filter or a lattice type filter, and
wherein said one of the series resonators having said inductance connected in parallel thereto is located in a foremost stage of said ladder or lattice type filter closest to the input terminal.

11. A duplexer comprising two or more filters that are connected to a common terminal and that have different passbands, at least one of the two or more filters comprising:
a plurality of series resonators connected in series to a path between an input terminal and an output terminal;
a parallel resonator connected in parallel to said path; and
an inductance connected in parallel to one of the series resonators,
wherein said one of the series resonators having said inductance connected in parallel thereto is constituted of a plurality of piezoelectric thin film resonators connected in series, said plurality of piezoelectric thin film resonators each comprising:
a piezoelectric film; and
an upper electrode and a lower electrode facing each other through the piezoelectric film interposed therebetween,
wherein a shape of a resonance region where the upper electrode and the lower electrode face each other through the piezoelectric film interposed therebetween differs from one another among the said plurality of piezoelectric thin film resonators.

12. The duplexer according to claim 11, wherein said plurality of piezoelectric thin film resonators have a same capacitance.

13. The duplexer according to claim 11, wherein the resonance regions of said plurality of piezoelectric thin film resonators have trapezium shapes having a same area, but different in shape among said plurality of piezoelectric thin film resonators.

14. The duplexer according to claim 11, wherein the resonance regions of said plurality of piezoelectric thin film resonators have rectangular shapes having a same area, but different in the ratio of a long side to a short side thereof among said plurality of piezoelectric thin film resonators.

15. The duplexer according to claim 11, wherein the resonance regions of said plurality of piezoelectric thin film resonators have elliptic shapes having a same area, but different in the ratio of the major axis to the minor axis thereof among said plurality of piezoelectric thin film resonators.

16. The duplexer according to claim 11, wherein said at least one of the two or more filters is a ladder type filter or a lattice type filter, and
wherein said one of the series resonators having said inductance connected in parallel thereto is located in a foremost stage of said ladder or lattice type filter closest to the input terminal.

* * * * *